United States Patent
Arnz et al.

(10) Patent No.: US 9,303,975 B2
(45) Date of Patent: Apr. 5, 2016

(54) METHOD FOR DETERMINING THE REGISTRATION OF A STRUCTURE ON A PHOTOMASK AND APPARATUS TO PERFORM THE METHOD

(75) Inventors: Michael Arnz, Oberkochen (DE); Dirk Seidel, Jena (DE); Gerd Klose, Tokyo (JP)

(73) Assignees: Carl Zeiss SMT GmbH, Oberkochen (DE); Carl Zeiss SMS GmbH, Jena (DE); Carl Zeiss Meditec AG, Jena (DE)

( * ) Notice: Subject to any disclaimer, the term of this patent is extended or adjusted under 35 U.S.C. 154(b) by 105 days.

(21) Appl. No.: 13/229,396

(22) Filed: Sep. 9, 2011

(65) Prior Publication Data
US 2012/0063666 A1 Mar. 15, 2012

Related U.S. Application Data

(60) Provisional application No. 61/381,700, filed on Sep. 10, 2010.

(30) Foreign Application Priority Data

Sep. 10, 2010 (DE) .......................... 10 2010 045 135

(51) Int. Cl.
*G01B 11/00* (2006.01)
*G03F 1/42* (2012.01)
*G03F 1/84* (2012.01)

(52) U.S. Cl.
CPC *G01B 11/00* (2013.01); *G03F 1/42* (2013.01); *G03F 1/84* (2013.01)

(58) Field of Classification Search
None
See application file for complete search history.

(56) References Cited

U.S. PATENT DOCUMENTS

| 6,291,113 | B1 * | 9/2001 | Spence | 430/5 |
| 6,920,249 | B2 | 7/2005 | Rinn et al. | 382/199 |
| 7,387,859 | B2 | 6/2008 | Gerlach | 430/22 |

(Continued)

FOREIGN PATENT DOCUMENTS

| DE | 10047211 | 5/2002 | G01B 11/00 |
| DE | 10337767 | 3/2005 | G03F 7/20 |

(Continued)

OTHER PUBLICATIONS

Cheng, Mosong, and Andrew R. Neureuther. "ArF imaging modeling by using resist simulation and pattern matching." 26th Annual International Symposium on Microlithography. International Society for Optics and Photonics, 2001.*

(Continued)

*Primary Examiner* — Nirav G Patel
(74) *Attorney, Agent, or Firm* — Fish & Richardson P.C.

(57) ABSTRACT

A method for determining a registration error of a feature on a mask, including providing a first aerial image that was captured by means of a position measuring device and includes at least the feature, simulating, from pattern specifications of the mask, a second aerial image that includes at least the feature, taking into account at least one effect that causes distortion of the first aerial image, and determining the registration error of the feature as the distance of the position of the feature in the first aerial image from the position of the feature in the second aerial image. Also provided is a method for simulating an aerial image from pattern specifications of a mask and a position measuring device for carrying out the method.

46 Claims, 15 Drawing Sheets

(56) References Cited

U.S. PATENT DOCUMENTS

| | | |
|---|---|---|
| 2002/0062206 A1 | 5/2002 | Liebchen .................... 703/6 |
| 2003/0129503 A1* | 7/2003 | Bourdillon ................... 430/5 |
| 2003/0219154 A1* | 11/2003 | Medvedeva et al. ......... 382/144 |
| 2004/0015808 A1* | 1/2004 | Pang et al. ................... 716/19 |
| 2004/0199349 A1* | 10/2004 | Ivanovic et al. ............. 702/94 |
| 2004/0216065 A1* | 10/2004 | Cobb et al. .................. 716/8 |
| 2005/0210438 A1 | 9/2005 | Verstappen et al. ......... 716/21 |
| 2006/0048089 A1* | 3/2006 | Schwarzband ............... 716/21 |
| 2007/0061772 A1* | 3/2007 | Ye et al. ....................... 716/21 |
| 2008/0175491 A1* | 7/2008 | Kondo .......................... 382/232 |
| 2008/0247632 A1* | 10/2008 | Boehm et al. ................ 382/144 |
| 2010/0208935 A1 | 8/2010 | Arnz et al. ................... 382/100 |
| 2011/0090329 A1* | 4/2011 | Poortinga et al. ............ 348/79 |

FOREIGN PATENT DOCUMENTS

| | | | |
|---|---|---|---|
| DE | 102006059431 | 6/2008 | ............... G03F 7/20 |
| DE | 102007033815 | 11/2008 | ............... G03F 9/00 |
| EP | 1202119 A1 | 5/2002 | ............... G03F 7/20 |

OTHER PUBLICATIONS

ElGindy, "Slicing an ear using prune-and-search," Pattern Recognition Letters 14, 719-722, (1993).

Hopkins, "On the Diffraction Theory of Optical Images," Proceedings of the Royal Society of London, Series A, Mathematical and Physical Sciences 217, 408-432, (1953).

Totzeck, "Numerical simulation of high-NA quantitative polarization microscopy and corresponding near-fields", Optik 112, No. 9, 399-406, (2001).

Cole et al., "Using Advanced Simulation to Aid Microlithography Development," Proceedings of the IEEE, vol. 89, No. 8, pp. 1194-1213, Aug. 2001.

German Search Report, German Patent Application No. 102010045135.5, 5 pages, Jul. 13, 2011.

\* cited by examiner

METHOD FOR DETERMINING THE REGISTRATION OF A STRUCTURE ON A PHOTOMASK AND APPARATUS TO PERFORM THE METHOD

CROSS REFERENCE TO RELATED APPLICATIONS

Pursuant to 35 U.S.C. §119, this application claims the benefit of U.S. provisional application 61/381,700, filed Sep. 10, 2010 and German application DE 102010045135.5, filed Sep. 10, 2010. The above applications are incorporated by reference.

BACKGROUND OF THE INVENTION

This patent specification is directed to a method for determining a registration error of a feature on a mask.

This patent specification is also directed to a method for simulating an aerial image from pattern specifications of a mask.

The patent specification is also directed to a position measuring device for carrying out the method.

In lithography for semiconductor component fabrication, the patterns of masks, which are also referred to synonymously as reticles, are projected by means of scanners or steppers onto wafers coated with a light-sensitive layer, the resist. Masks can be configured, for example, as "binary masks," with chromium patterns on quartz glass, or as phase-shift masks. For EUV lithography applications, reflective masks are used. Templates for the nanoimprint process are another variety of mask. With the aid of mask inspection microscopes or position measuring devices, the pattern of a reticle is projected by means of lenses onto a light-sensitive local-resolution detector, such as, for example, a CCD (Charge Coupled Device) chip.

By means of a position measuring device (registration tool), features on a mask that are specifically designated as registration patterns or as markers, for example squares, crosses or angles of specific shapes, are measured and compared with their nominal positions. Positions on the mask of features that are details of the patterns used on the mask are also measured. This is known as "real pattern registration." The deviation of the nominal position of a feature from its actual position on the mask is the placement error, which is also known as the "registration" or "registration error."

The measurement of masks makes it possible to check the positional accuracy of the patterns on the mask during the electron-beam mask-writing process. In addition, by measuring the patterns of an existing set of masks, the deviations of the pattern positions on the various masks can be adjusted to each other for the individual lithographic layers.

To check the positions of features, an aerial image of a detail of a mask is captured with a position measuring device. The mask rests for this purpose on a stage (also known as an object table or traversing unit) that serves to move the mask in the direction of the mask plane, in order to position a desired detail in the image field of the positioning measuring device so that the image can be captured with a detector. Before the measurement is performed, the mask is oriented on the stage in such a way that its position on the stage is known. Alternatively, relative alignment with special alignment features can be performed. The position determination is then made in relation to these features, which are also known as alignment markers. The image can thus be assigned unequivocally to the absolute or relative position of the detail on the mask. By determining the position of the pattern in the captured image, it becomes possible to compare the nominal and actual positions of the patterns on the mask, and thus to calculate the placement error.

Metrological requirements for placement error determination currently stand at 1 nm. Feature placement errors can be determined, for example, via methods for determining the positions of these features in aerial images. Examples of the known methods are threshold value methods and correlation methods. Accuracy requirements for the to-be-determined position or placement error of a feature are higher than the resolution of an aerial image captured by the position measuring device. In current devices, the edge lengths of a pixel of an aerial image correspond, for example, to 25 nm in mask dimensions. Methods have been developed that permit so-called subpixel-accurate position determination of a feature in an aerial image.

For example, DE1 2006059431 describes a method for determining the position of a pattern on a substrate with subpixel accuracy in relation to a reference point on the substrate by overlaying the pattern with a reference pattern.

Known from DE10047211 is a method for determining the positions of edges of a pattern with subpixel accuracy. Here, the measured edge profiles are compared with model intensity profiles to find the position of best fit.

DE10337767 discloses a method for determining the distance between a reference element and a pattern for measuring the overlay shift.

DE102007033815 discloses a method for determining the distance between a reference element and a pattern by means of two pattern elements for measuring the overlay shift, wherein in the reference element or in the pattern, one of the pattern elements whose position is to be determined is amplified.

These methods have not yet made it possible to achieve the requirements imposed on the next generation of position measuring devices.

SUMMARY

In one aspect, the invention provides an efficient method that permits accurate determination of the registration error of a feature on a mask. For example, metrological requirements for registration error determination can be as small as 0.5 nm. Specialized aerial image analysis methods are used to satisfy these requirements.

In another aspect of the invention, a method is provided for accurate determination of a registration error of a feature on a mask. The method comprises the steps of:

providing a first aerial image that was captured by means of a position measuring device and includes at least the feature, simulating, from pattern specifications of the mask, a second aerial image that includes at least the feature, taking into account at least one effect that causes distortion of the first aerial image, and determining the registration error of the feature as the distance of the position of the feature in the first aerial image from the position of the feature in the second aerial image.

This measure has the advantage that registration errors introduced as artifacts by distortions occurring during the generation of the aerial image are taken into account in the analysis of the first aerial image. Registration error results thus are not falsified by these distortions.

The aerial image is, for example, captured with a two-dimensional detector and provided as a two-dimensional matrix composed of pixels. Intensity values of the individual pixels are represented by numerical values.

Features on the mask can be, for example, crosses or squares, which can be written onto the mask for inspection purposes. The method is also suitable for determining the registration errors of device patterns or details thereof, for example an edge or a corner. The method according to the invention can also be used to measure line widths. The line width, and thus its deviation from a nominal value, is derived from the positions or registration errors of the two edges of a line.

The first aerial image includes a detail of the mask. This can be defined by means of an image field of the position measuring device. The region of the second aerial image can be identical. It can also be different, for example smaller than the detail of the first aerial image, for example limited to the feature.

The position of the feature in the first aerial image represents the actual position of the feature on the mask, falsified by distortion of the aerial image. The position of the feature in the second aerial image represents the nominal position of the feature on the mask, falsified by distortion of the aerial image. The distance between the positions of the first and second aerial images is no longer affected by distortion.

The method can also include the capture of the first aerial image.

The second aerial image is determined by simulation. All effects that can occur in the optical beam path of the position measuring device, including the mask, can be taken into account here, in whole or in part. These effects include, for example, characteristics of the illumination, such as the wavelength, the intensity, the polarization or the degree of coherence of the illuminating light, the illumination setting used, the field homogeneity of the illumination intensity. Characteristics of the mask, such as, for example, the three-dimensional topography (the height relief) of the mask or the complex refractive index of the mask material, are also included in the simulation. Examples of the effects of the imaging beam path include: the numerical aperture and the imaging error of the objective lens, pupil apodization, and polarization. Proximity effects are also included in the simulation.

In a further embodiment of the invention, at least one of the following effects is taken into account in the simulation of the second aerial image: proximity effects, distortion due to an objective lens of the position measuring device, topography of the mask, and refractive index of the mask.

This measure has the advantage that essential effects are taken into account, but computing complexity is still limited. It is feasible to take these effects into account in the simulation of aerial images.

Proximity effects may cause considerable distortion, especially when measurements are being performed on small patterns close to the limit of resolution of a position measuring device.

Proximity effects are to be described as resolution-induced intrinsic distortions. These are attributable to the nature of the diffraction-limited resolution of a projected image. The causes lie not only in the environment of a pattern, but also in the pattern itself. These effects can be taken into account in the simulation.

Distortion due to the objective lens of the position measuring device can be determined and therefore readily taken into account in the simulation of the second aerial image.

The topography of the mask and the refractive index or complex refractive index of the mask material can also be determined and taken into account in the simulation.

In a further embodiment of the invention, the simulation of the second aerial image is based on a mask pattern that has, at least in part, a higher resolution than the first aerial image.

This measure has the advantage the discretization errors in the calculation of the aerial image are minimized.

Since the positions of features in the first and second aerial images are to be determined with subpixel accuracy, a method that produces a position-sensitive aerial image is advantageous for simulating the second aerial image. The mask pattern on which the aerial image simulation is based is in the form of a transmission function or a reflection function. Hereinafter, the term "transmission function" also encompasses the term "reflection function."

To minimize computing complexity, in a variant of this embodiment, the calculation of the aerial images using this high resolution of the transmission function of the mask is limited to regions relevant to the position determination. The resolution of the mask pattern, i.e., the transmission function of the mask, is preferably 1 nm/pixel or 0.5 nm/pixel. The stated measurements refer to the dimensions of the mask. The pixel size refers to the resolution of the first aerial image and is defined by the design of the detector of the position measuring device.

In a further embodiment of the invention, the simulation of the second aerial image is based on pattern specifications of the mask that are in the form of a continuous transmission function, the second aerial image being determined as a matrix of discrete intensity values, a discretization of the spectrum of the mask being performed without further approximation.

This measure has the advantage of providing an efficient method for the simulation of position-sensitive aerial images. Displacements of features due to errors caused by a discretization of the transmission function are avoided.

In an advantageous variant of this measure, the continuous transmission function is decomposed into a sum of functions. The individual functions describe basic building blocks of the pattern specifications or transmission functions of the mask. The building blocks are configured, for example, as triangles, since all polyhedra deriving from the pattern specifications of current masks can be decomposed into triangles.

In a further embodiment of the invention, at least one region of the feature is defined that will be taken into account in determining the distance.

This measure has the advantage that regions that are particularly position-sensitive are selected. This increases the accuracy of the method while at the same time minimizing computing complexity.

Plural regions of the feature can also be selected. This increases the accuracy of the pattern determination.

In a further embodiment of the invention, the at least one region of the feature is embodied as an edge of the feature.

This measure has the advantage that particularly position-sensitive regions can be included in the position determination. Due to the comparatively high intensity gradients of edges of features in aerial images, these change radically with position.

In a further embodiment of this measure, plural edges are selected to further increase the accuracy of measurement.

In a further embodiment of the invention, the method includes the steps of:
  designating, in the first and the second aerial image, at least one region of the feature that is to be taken into account in determining the registration error,
  determining the at least one first and second position of the at least one region, and determining the distance on the basis of the at least one first and second positions of the at least one region in the aerial images.

This measure has the advantage that the same method for determining the positions of the regions (the first and the second position) can be used on both aerial images (the first aerial image and the second aerial image). In this way, there are no discrepancies between different methods that would falsify the registration errors.

In a further embodiment of the invention, the position of the feature is determined by means of the position of at least one edge of the feature, the position of said edge being determined by a threshold value method.

This measure has the advantage that the position of the feature can be determined in a simple and fast manner.

The threshold value method, also known as the threshold method, makes it possible to determine the position of an edge without having to know the profile of an edge. The position of the edge is determined from an edge profile using a threshold value of, for example, 70% of the maximum intensities in the aerial image.

The above method can be used to directly determine the position of the designated region in an aerial image for a defined threshold value. Subpixel-accurate position determination is also possible.

In a further embodiment of the invention, the method comprises the steps of:
  designating at least one region in the first or the second aerial image,
  determining a position of the region in the other aerial image, and
  determining the distance on the basis of the at least one difference between the positions of the at least one region in the aerial images.

This measure has the advantage of providing high-accuracy methods for determining the respective positions of regions of an image in another image.

The at least one region can be designated in the first aerial image and the position of the region determined in the second aerial image. The region can also be designated in the second aerial image and the position of the region determined in the first aerial image.

The at least one difference between the distances separating the positions for a feature and the pattern specifications of the mask can be used to determine the actual position of this region.

The positions can be determined with subpixel accuracy by this method.

In a further embodiment of the invention, the position of the at least one region is determined by the least squares method.

This measure has the advantage of making it possible also to determine the positions of regions that have intensity discontinuities in their edge regions.

These discontinuities make it impossible to use cross-correlation for position determination, since the Fourier spectrum of such images is not bandwidth-limited. This measure makes it possible to determine positions of arbitrary details of patterns, including details of device patterns, such as corners or edges, for example, in aerial images.

In a further embodiment of the invention, the at least one designated region is masked, all the image data of the aerial image being suppressed outside the masked region.

This measure has the advantage that a simple and fast method can be used for position determination. Since the size of the first and second aerial images remains the same because of the masking, the use of correlation methods is greatly simplified.

Other regions in an aerial image can also be masked.

In a further embodiment of the invention, a first position of the at least one edge derived from the pattern specifications of the mask is adopted as the nominal position. A second position of the edge is determined as the actual position, based on the pattern specifications of the mask and the difference between the positions of the at least one region in the aerial images.

This measure has the advantage that the nominal and actual positions of edges can also be determined on the basis of correlation methods.

From the positions of the edges the position of a feature can also be determined, for example as the position of the center of symmetry.

In a further embodiment of the invention, the method comprises the steps of:
  determining a first position of the feature in the first aerial image, from at least one first position of an edge,
  determining a second position of the feature in the second aerial image, from the at least one second position of an edge, and
  determining the distance as the difference between the first position and the second position.

This measure has the advantage of providing an efficient method for identifying features from edge positions.

The position of a feature can be determined, for example, from the positions of the center of symmetry. A characteristic position of the feature can also be determined by statistical methods, such as the least squares method, for example, using the positions of plural edges.

In a further embodiment of the invention, the at least one region includes the feature.

This measure has the advantage that only one position determination need be performed. Designating the detail simultaneously serves the purpose of designating the feature whose registration error is to be determined.

Further according to the invention, a method is provided for simulating an aerial image from pattern specifications of a mask, wherein the aerial image is determined as a matrix composed of pixels having intensity values, taking as a basis the pattern specifications of the mask in the form of a transmission function that has, at least in part, a higher resolution than the first aerial image.

This method makes it possible to simulate position-sensitive aerial images. Numerous advantages of the method and of the following embodiments have already been stated.

In a further embodiment of the invention, the pattern specifications of the mask are present in the form of a continuous transmission function, and a discretization of the spectrum of the mask is performed without further approximation.

In a further embodiment of the invention, the continuous transmission function is decomposed into a sum of functions that describe the basic building blocks of the pattern specifications.

In a further embodiment of the invention, the building blocks are configured as triangles.

In a further embodiment of the invention, the pattern specifications of the mask are transformed into a matrix.

This measure has the advantage that the aerial image can be simulated in a simple manner by determining the complex spectrum of this matrix.

In a further embodiment of the invention, the resolution matrix varies.

This measure has the advantage that the computing complexity for simulating the aerial image is limited. The resolution of the matrix can be increased in regions with higher intensity gradients (such as, for example, in the vicinity of edges).

Further according to the invention, a position measuring device is provided, comprising a control unit that performs the following steps:

providing a first aerial image that is captured by means of the position measuring device and includes at least the feature, simulating a second aerial image that includes at least the feature on the basis of pattern specifications of the mask, taking into account at least one effect that causes distortion of the first aerial image, and determining the registration error of the feature as the distance of the position of the feature in the first aerial image from the position of the feature in the second aerial image.

The control unit is, for example, a computer programmed such that the aforesaid steps can be performed. The control unit programmed such that all the aforesaid methods and their embodiments can be carried out.

For example, the illumination setting and the polarization of the illuminating light from the position measuring device are preset for the capture of the first aerial image. These presets can be taken into account in the simulation of the second aerial image.

It is understood that the characteristics of the invention cited above and explained in more below can be used not only in the described combinations, but also in other combinations, without departing from the scope of the present invention.

The invention will be described and explained in more detail below on the basis of a few selected exemplary embodiments and with reference to the drawings.

DETAILED DESCRIPTION

Figure 1:
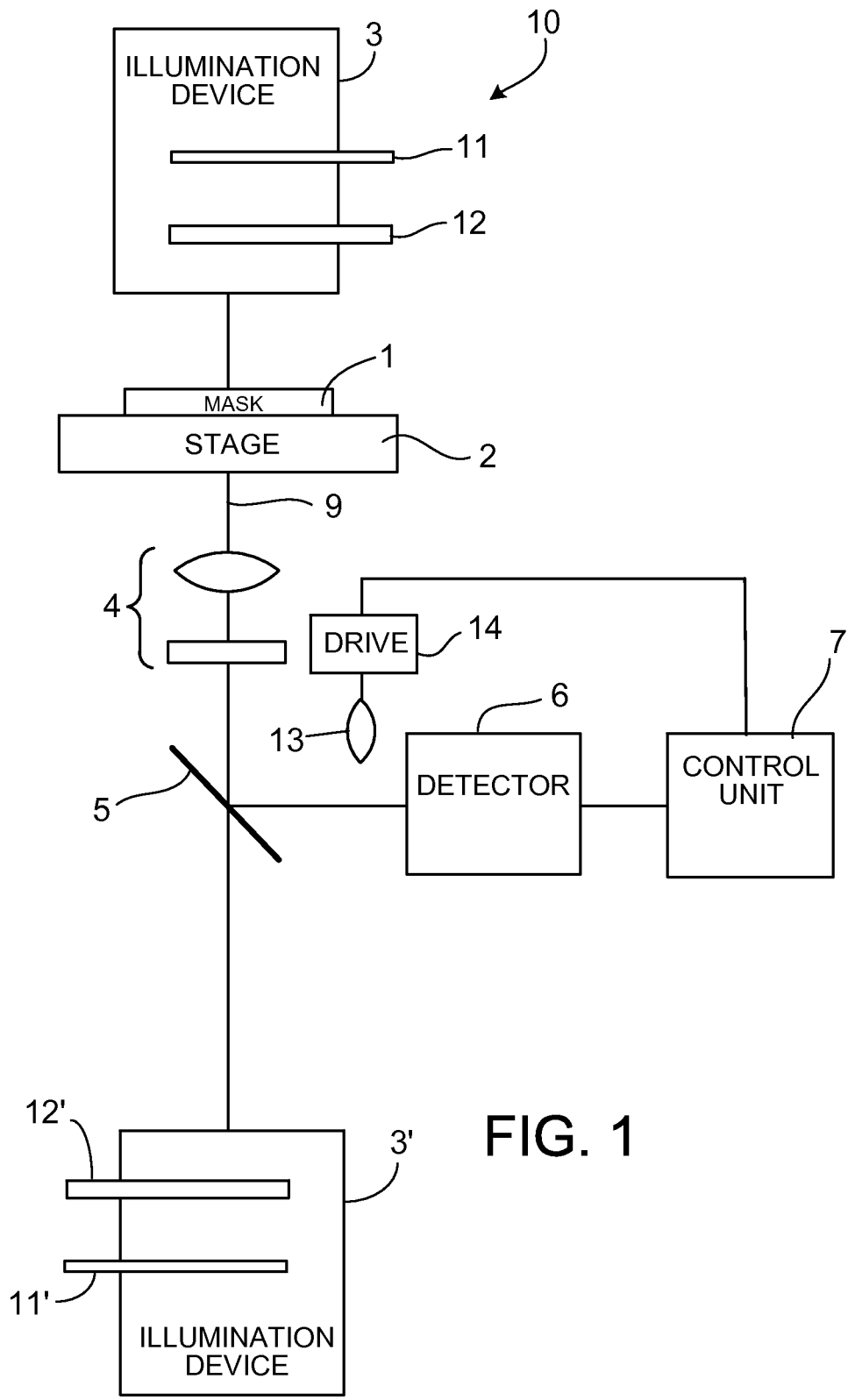
FIG. 1 is a schematic diagram of a position measuring device.

FIG. 1 depicts a position measuring device 10 that serves to measure the position of patterns on masks.

A mask 1 for photolithography is placed on a stage 2. The stage 2 can be moved in three spatial directions to position the mask 1. To ensure high accuracy, the current position or the path difference is monitored by means of laser interferometric or other high-precision measuring instruments (not shown). The mask 1 and the stage 2 are arranged horizontally; the mask plane is denoted the xy-plane. Disposed above the stage 2 with the mask 1 is an illumination device 3. This includes at least one illumination source emitting coherent illuminating light, which illuminates the mask via an illumination beam path. The illuminating light source can be embodied, for example, as a laser that emits light with a wavelength of 193 nm. The illumination device 3 serves to shine light through the mask 1. On the other side of the stage 2 is another illumination device 3', which serves to illuminate the mask 1 with incident light. Stops 11 and 11' are used to configure illumination settings, such as, for example, dipole, quadrupole, annular, etc. The polarization of the illuminating light is set via polarizers 12, 12'. To center the stop 11 or 11', a Bertrand lens 13 is brought into the beam path by drive 14. The pupil plane of the imaging beam path of the position measuring device 10 is then projected onto a detector 6.

A detail of the mask 1 that is located in the image field is projected through a projection lens 4 and a beam splitter 5, using either the light passing through the mask 1 or the light reflected by it, onto the local-resolution detector 6 embodied as a CCD (charge coupled device) camera. The optical axis of the projection lens 4 is denoted by reference numeral 9, and its direction is designated the z-direction. The detected intensities of the first aerial image are digitized and stored as a grayscale image by a control unit 7, embodied as a computer with a monitor. This image is configured as a matrix of 1000× 1000 pixels based on intensity values.

Measurement of the positions of patterns on the mask 1 is performed in relation to reference markings (alignment markers) on the mask 1. The positions of patterns on the mask are stated in terms of the mask coordinate system. This is defined by two mutually perpendicular axes denoted x and y. To measure the positions of the patterns relative to the mask surface, before the individual positions of the patterns are measured, the position of the mask on the stage is determined. This can be done, for example, by determining the respective positions of the edges of the mask 1 in relation to special features, known as markers, whose positions on the stage are known. The laboratory coordinate system is defined by the positions of the markers on the stage. The coordinate system of the image field of the first aerial image to be captured and of the first aerial image itself is a right-angled coordinate system whose x- and y-axes are parallel to the axes of the mask coordinate system. The origin is at the center of the image. The position of the aerial image or of the image field in relation to the mask is given by the position of the origin in the mask coordinate system.

The following discussion relates to the mask coordinate system. As stated above, it is possible to convert the positions to other reference systems, such as, for example, the laboratory coordinate system.

To take an aerial image of the mask 1, the latter is oriented in the xy-plane so that the desired region comes to lie in the image field of the position measuring device and is projected onto the detector 6. Once the best focus plane has been determined by moving the stage 2 in the z-direction, a grayscale image is taken by the detector 6 and the control unit 7. In a variant of the method, additional aerial images are taken parallel to the best focus plane; these are known as focus stacks. For example, 7 or 9 aerial images are taken at distances from the best focus plane in both directions of the optical axis, for example at intervals of 150 nm. The registration error determination is performed individually for each of the images in a focus stack. The image sharpness is also evaluated for each focus stack. The registration error is used to generate a function that depends on image sharpness. The value of this function at the point of best image sharpness is the most accurate value of the registration error.

The simulation of the second aerial image is performed by means of commercially available software, such as Micro-Sim, for example, based on the pattern specifications of the mask, the mask design. The MicroSim software is described, for example, in: M. Totzeck, "Numerical simulation of high-NA quantitative polarization microscopy and corresponding near-fields," *Optik* 112 (2001), 381-390 (MicroSim-Software, University of Stuttgart). The imaging conditions of the position measuring device, such as, for example, numerical aperture, wavelength, degree of coherence of the illumination, etc., are taken into account in the simulation. Effects that cause distortion of the aerial image during the imaging of the mask by the position measuring device, particularly proximity effects, are taken into account. With regard to proximity effects and aerial image simulation, see the article: H. H. Hopkins, "On the diffraction theory of optical images," *Proceedings of the Royal Society of London*, Series A, *Mathematical and Physical Sciences* 217/1130 (1953), 408-432.

To carry out the method, in a variant, a simulation of the second aerial image with higher resolution of the transmission function of the mask is used. This measure particularly has the effect of minimizing discretization errors in the calculation of the aerial image. The extent of a pixel of the detector 6 in the x- and y-directions is consistently 25 nm, referred to the dimensions of the mask. Calculation of a transmission function with the resolution at the ideally needed 1 nm/pixel results in a matrix of 25,000×25,000 pixels. To minimize computing complexity, only the relevant regions of the aerial image are calculated using this high resolution of the transmission function or reflection function of the mask.

The procedure used to simulate the aerial images is as follows. The intensities of an aerial image composed of a matrix of n×m pixels are determined for each illumination direction j as:

$$I_{nm}^{(j)} = \left| \sum_{n'=1}^{N} \sum_{m'=1}^{M} S_{n'm'} P_{n'm'}^{(j)} e^{2\pi i(n'-1)(n-1)/N} e^{2\pi i(m'-1)(m-1)/M} \right|^2 \quad \text{I}$$

The total intensity is obtained as the weighted sum over all the illumination directions j, where $\omega_j$ are the associated weighting factors:

$$I_{nm}^G = \sum_j \omega_j I_{nm}^j \quad \text{II}$$

$S_{nm}$ is the complex spectrum of the mask, i.e., the Fourier transform of the transmission function of the mask. The transmission function of the mask is obtained as a continuous function $\hat{M}(x, y)$ from the pattern specifications of the mask.

$P_{nm}^{(j)}$ is the complex transmission function of the pupil, which describes the numerical aperture, aberrations and the illumination angle.

It is not generally possible to calculate the complex spectrum of an arbitrary continuous function $\hat{M}(x, y)$ analytically. In a variant of the method, the continuous transmission function of the mask is discretized. It is thereby transformed into a matrix $\hat{M}_{nm} = \hat{M}(x_n, y_n)$ composed of n×m pixels. The complex spectrum of this transmission function can be calculated by:

$$S_{nm} = \sum_{n'=1}^{N} \sum_{m'=1}^{M} \hat{M}_{nm} e^{-2\pi i(n'-1)(n-1)/N} e^{2\pi i(m'-1)(m-1)/M} \quad \text{III}$$

To permit subpixel-accurate analysis of the simulated aerial image, the intensities of the individual pixels of the simulated aerial image are reproduced with an accuracy of 1 nm or better, based on the dimensions of the mask. The size of a pixel in an aerial image captured with a position measuring device has an edge length of 25 nm, referred to the mask dimensions. The image is composed of a matrix of 1000×1000 pixels; the image field has an edge length of 25 μm.

Hence, the starting point for the simulation of an aerial image is a transmission function of the mask that has a resolution of 1 nm or even 0.5 nm per pixel of the captured aerial image. To keep the computing complexity low, this resolution is used only for regions that are relevant for position determination, such as selected regions of features, for example.

In a variant of the method, the continuous transmission function of the mask $\hat{M}(x, y)$ is decomposed into basic building blocks (pattern), which are described by functions $\hat{P}_k(x, y)$. Fourier transformation of the functions in these forms can then be performed analytically.

The decomposition into building blocks is effected in such a way that each building block has a constant complex transmission $t_k$. For example, in the case of a mask having patterns formed by chromium on quartz glass, the chromium-coated regions are decomposed into building blocks of a first complex transmission and the chromium-free building blocks into regions having a second complex transmission. The continuous transformation functions of the masks can be expressed as:

$$\hat{M}(x, y) = \sum_k t_k \hat{P}_k(x, y), \quad \text{IV}$$

where $$\hat{P}_k(x, y) = \begin{cases} 1 : \text{if } (x, y) \text{ is within a building block} \\ 0 : \text{otherwise} \end{cases}$$

Suitable building blocks are triangles. The mask patterns of current masks consist of polygons that can be decomposed into triangles. Analytical Fourier transformation of triangular areas is also possible. The complex spectrum $S_{nm}$ can be calculated as follows:

$$S_{nm} = \frac{1}{ab} \int_0^a \int_0^b \hat{M}(x, y) e^{-2\pi i(nx/a + my/b)} dx dy = \quad \text{V}$$

-continued $$\frac{1}{ab}\int_0^a\int_0^b\left(\sum_k t_k \hat{P}_k(x,y)\right)e^{-2\pi i(nx/a+my/b)}dx\,dy$$

$$=\sum_k t_k S_{nm}^{k,Triangle},$$

where a and b denote the edge lengths of the rectangular area to be simulated. This method eliminates the need to discretize the continuous transmission function of the mask. At the same time, the discretized spectrum $S_{nm}$ is calculated in the Fourier space.

Figure 21:
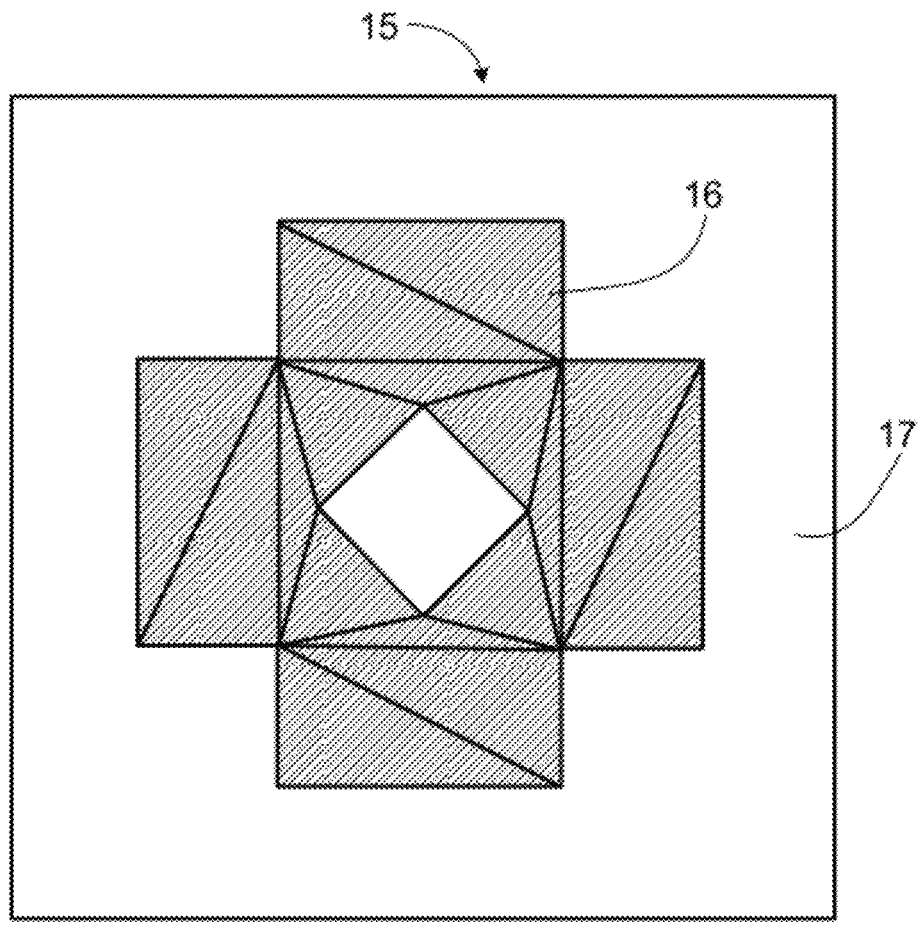
FIG. 21 shows an example of the decomposition of a transmission function of a mask into triangular regions.

To decompose the transmission function of the mask into triangles, a known algorithm is used. See H. ElGindy, H. Everett and G. T. Toussaint, "Slicing an ear using prune-and-search," *Pattern Recognition Letters* 14/9 (1993), 719-722. This can also be done manually. An example of the decomposition of a transmission function of a mask 15 into triangular building blocks is illustrated in FIG. 21. This shows only the triangulation of a region 16 of complex transmission, represented by the hatched areas in FIG. 21. The figure shows the decomposition into triangles of a cross-shaped marker 16 with a square opening at its center. The decomposition of region 17 of the mask 15, depicted in white and having a different complex transmission, is not illustrated in FIG. 21.

The distortions due to the objective lens of the position measuring device are determined by known methods and are present, for example, as a Zernike polynomial. The intensity distribution of the field plane can be measured with the position measuring device itself by taking an aerial image without a mask in the beam path. Alternatively, a mask with no patterns applied to it is brought into the beam path. To measure the intensity distribution of the pupil plane of the position measuring device 10, the Bertrand lens 13 is brought into the beam path. The three-dimensional topography of the mask is determined, for example, by methods such as atomic force microscopy. The complex refractive index of the mask material is determined, for example, by ellipsometry.

In a variant of the method, the position of a feature in the first (captured) aerial image or the second (simulated) aerial image is determined by determining the positions of selected edges of the feature. The edge positions are determined by a threshold value method that permits subpixel-accurate position determination.

The analysis will be explained based on the example of an edge of an aerial image of a feature configured as a cross composed of two bars L1 and L2. The aerial image is depicted in FIG. 2; the darker the shade of the pixels in question, the higher their intensity.

Figure 2:
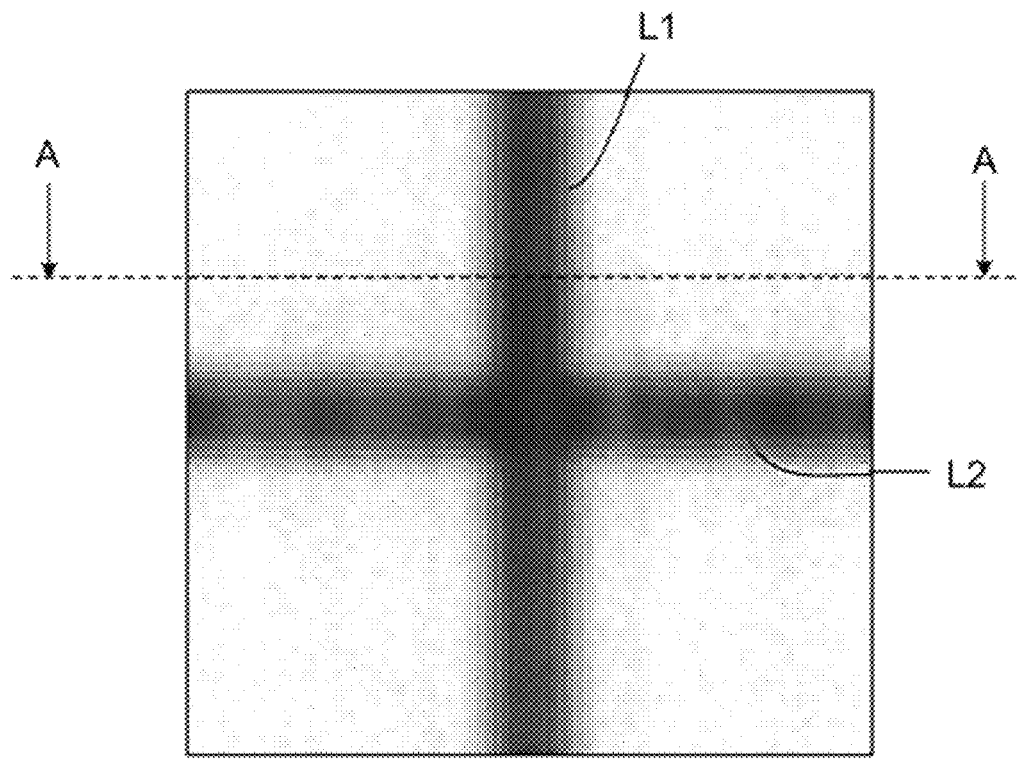
FIG. 2 is an aerial image of a feature.
Figure 3:
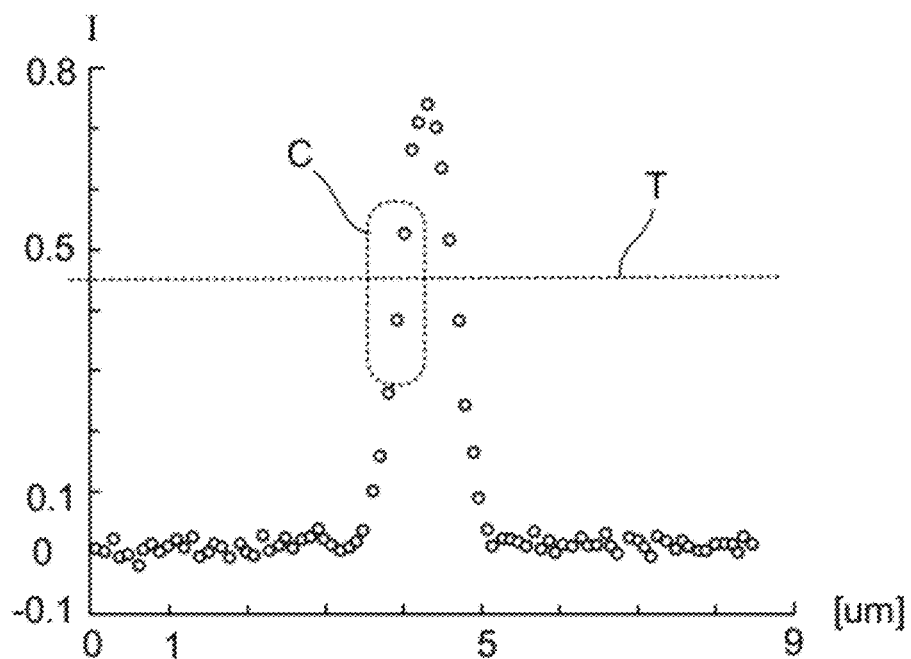
FIG. 3 is a graph showing the discrete intensity profile of the aerial image along section line A-A in FIG. 2.

The discrete intensity profile along section line A-A in FIG. 2 is illustrated schematically in FIG. 3, a circle being drawn in for each intensity value of a pixel. For easier comprehensibility, however, not all the pixels are shown. The coordinate in µm is plotted on the x-axis in FIG. 3, and the intensity I in relative units along the y-axis. FIG. 3 also shows the threshold value T for the intensity, which is set in order to determine the position of the edge. In the example described here, the width of the region captured per pixel in the x-direction is 25 nm, and the edge is therefore captured with this resolution of 25 nm in the x-direction. Each pixel P is assigned the center as its x-direction coordinate.

As is evident from the representation of FIG. 3, both the left and the right edges lie between two pixels. Region C is shown enlarged in the next figure, FIG. 4, where the pixels of the discrete intensity profile are numbered consecutively from 1 to 9.

Figure 4:
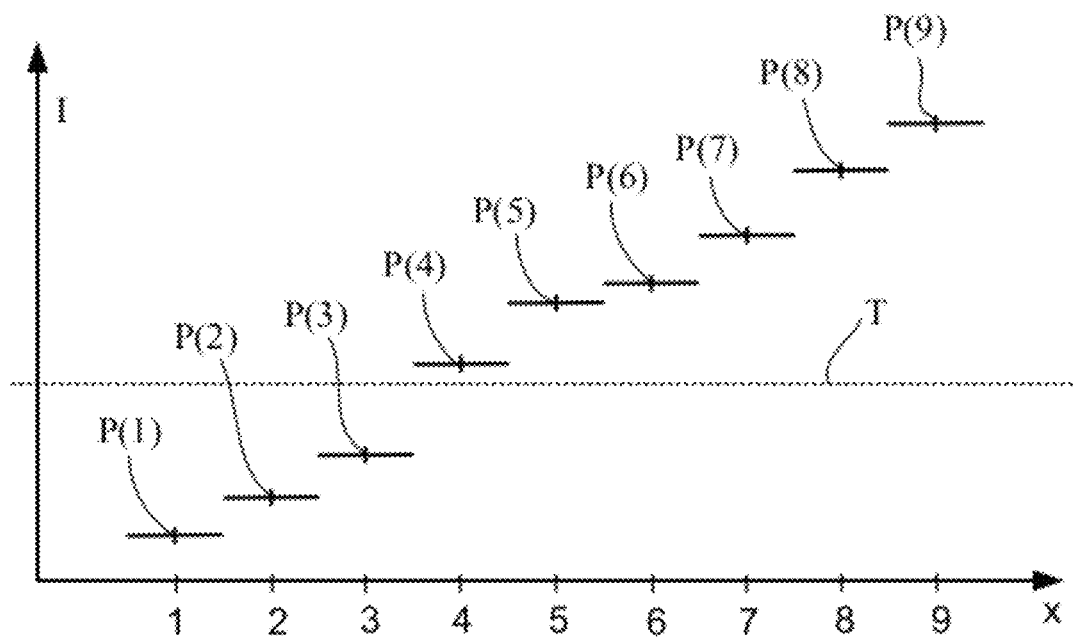
FIGS. 4-8 are graphs showing representations explaining subpixel-accurate position determination.

First, the pixel P whose intensity value is closest to the threshold value T is selected. In the example of FIG. 4, this is the fourth pixel P(4). This fourth pixel P(4) and the two adjacent pixels on each side, P(2), P(3), P(5) and P(6), are selected as the analysis pixels.

Figure 5:
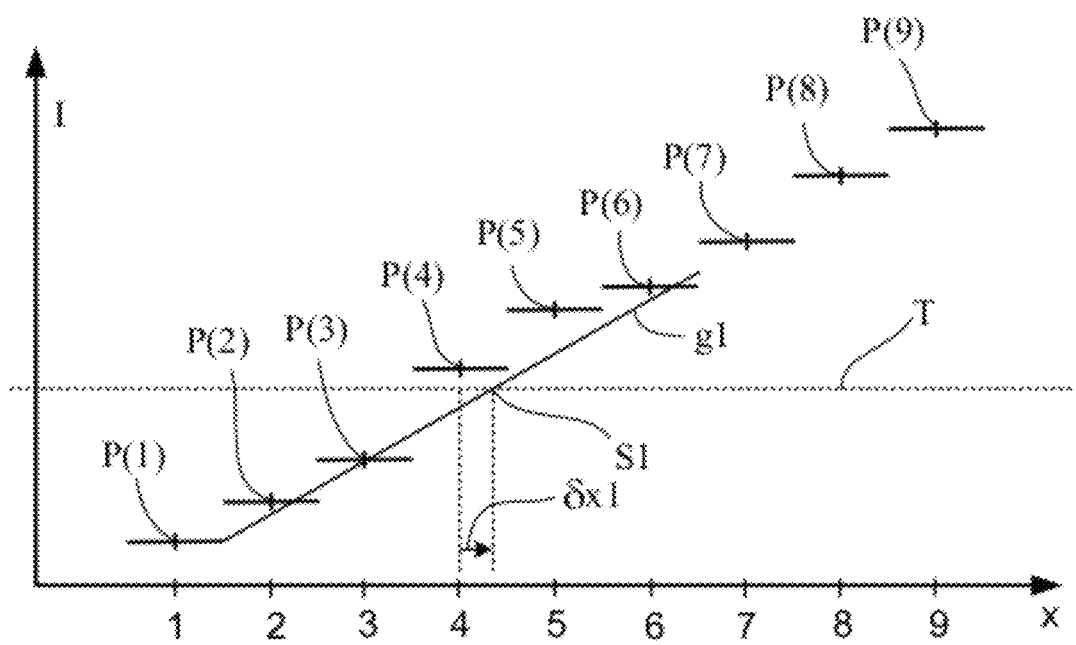

A line of best fit g1 is calculated for these five analysis pixels P(2)-P(6), as illustrated in FIG. 5. The intersection point S1 of the line of best fit g1 with the threshold value T or threshold value line T is then determined, as is the distance δx1 in the x-direction between the intersection point S1 and the pixel P(4) whose intensity value is closest to the threshold value T.

It is then determined whether the magnitude of the distance δx1 is greater than a maximum value e.

If this is not the case, the determined distance δx1 and any other distances that have been determined, as will be described below, are then added to the coordinate of pixel P(4) to obtain the edge position with subpixel accuracy.

Figure 6:
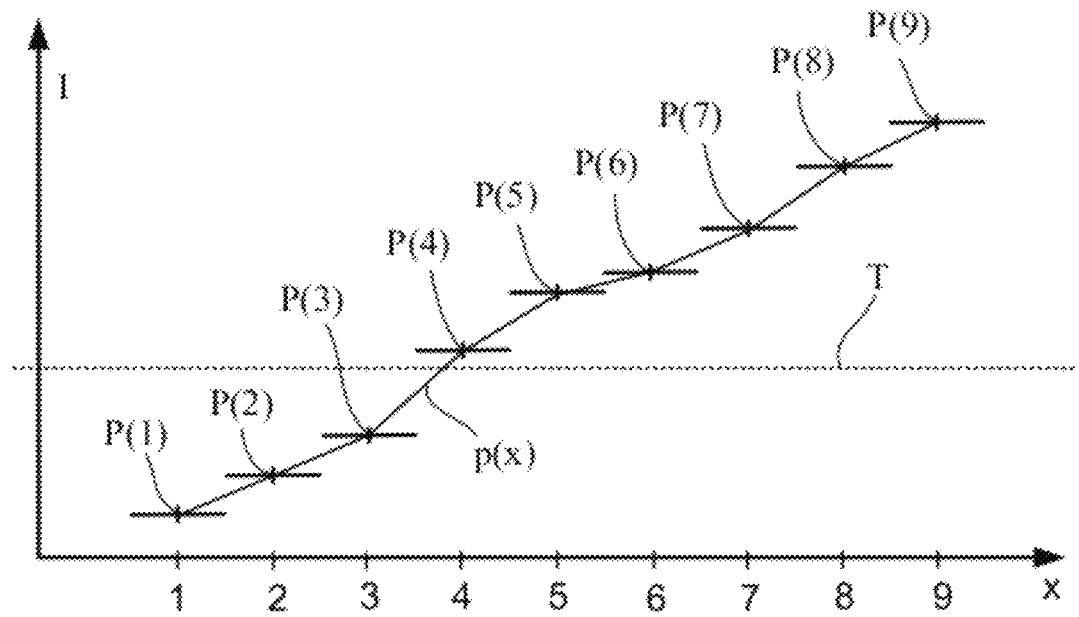
Figure 7:
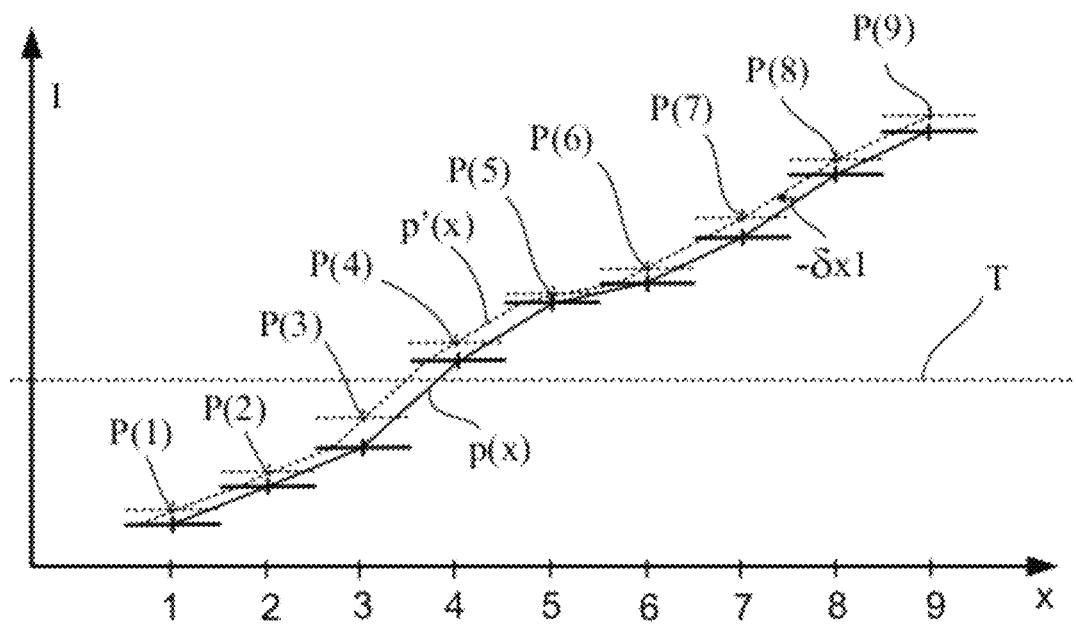

If δx is greater than e, a continuous profile function p(x) of the edge is shifted by −δx1. The continuous profile function p(x) of the edge, which is calculated as a function of the coordinate based on pixels P(1)-P(9), is plotted in FIG. 6. Here, the profile function p(x) is obtained, for example, by linear interpolation between two adjacent pixels P on each side. The shift of the continuous profile function p(x) is illustrated in FIG. 7, the shifted profile function p'(x) being represented in dotted form. The intensity value of the shifted profile function p'(x) is now determined at the respective coordinates of the pixels P, such that all the pixels P(1)-P(9) have modified intensity values. The new intensity values are represented in dotted form.

Figure 8:
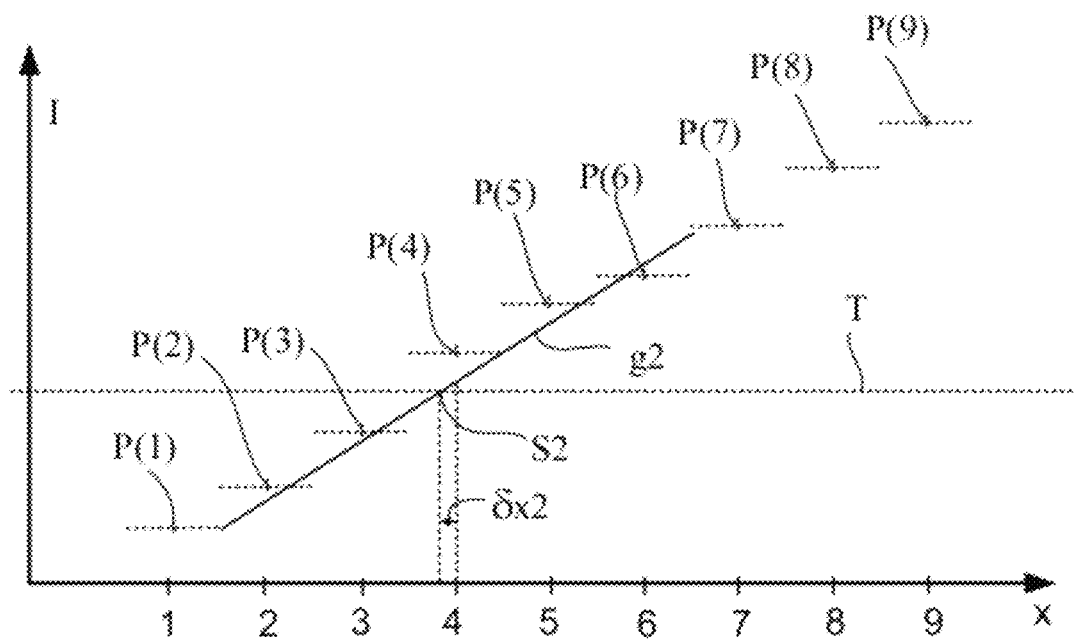

The pixel whose intensity value is closest to the threshold value T is then re-determined. This is again pixel P(4). Pixel P(4) and the two adjacent pixels in both directions are selected as analysis pixels. A line of best fit g2 is again determined for these analysis pixels P(2)-P(6), as illustrated in FIG. 8. The intersection point S2 of the lines of best fit g2 with the threshold value is determined, as is the distance δx2 of the intersection point S2 from the coordinate of the middle pixel P(4). If the determined distance δx2 is not greater than the maximum value e, the process is terminated and the edge position is determined with subpixel accuracy based on all the determined distances δx, as described above.

If, however, the determined distance δx2 is greater than the maximum value e, the already shifted profile function is shifted by $-\delta x_2$, the new intensity values of the pixels P are determined in the same manner as in FIG. 7, and the distance δx is then determined in the same manner as in FIG. 8. This is repeated until δx is no longer greater than the maximum value e. The position of the edge is then determined with subpixel accuracy from all the determined distances.

The position of the right edge can also be determined with subpixel accuracy by the above procedure. In particular, it is also possible to select the arithmetic mean of the two edge positions as the position of the perpendicular bar L1 (FIG. 2) of the feature.

Figure 9:
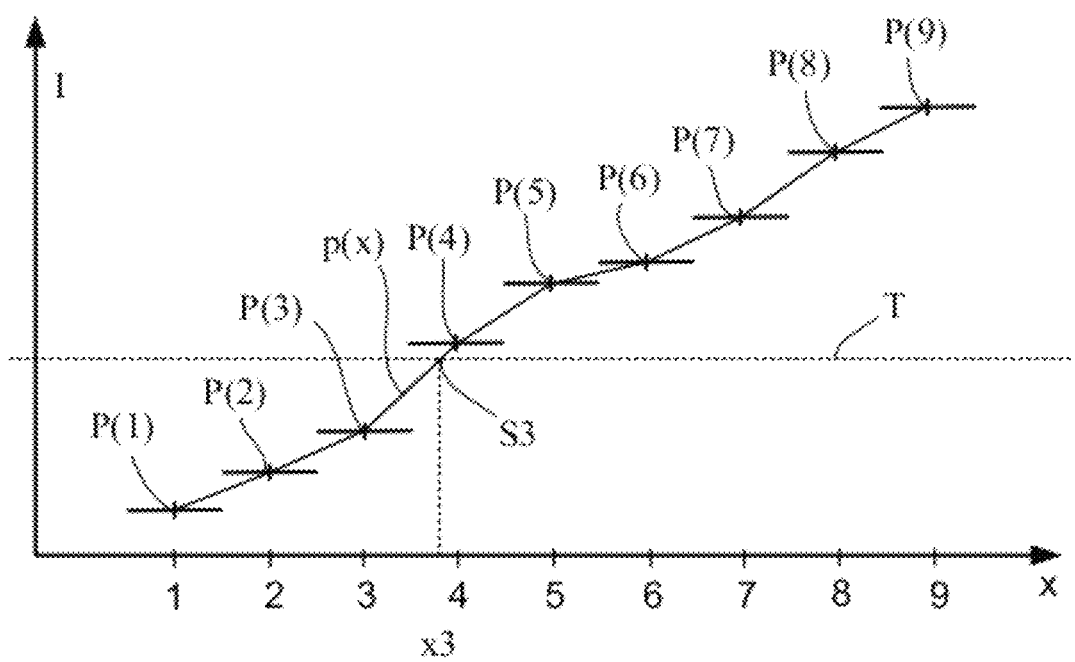
FIGS. 9-11 are graphs showing representations explaining another embodiment for subpixel-accurate position determination.

The positions of the edges can also be determined as follows. Proceeding from the discrete intensity profile of FIG. 2, the continuous profile function p(x) of the edge is calculated for region C as a function of the coordinate x, and thus based on pixels P(1)-P(9), as illustrated in FIG. 9.

Figure 10:
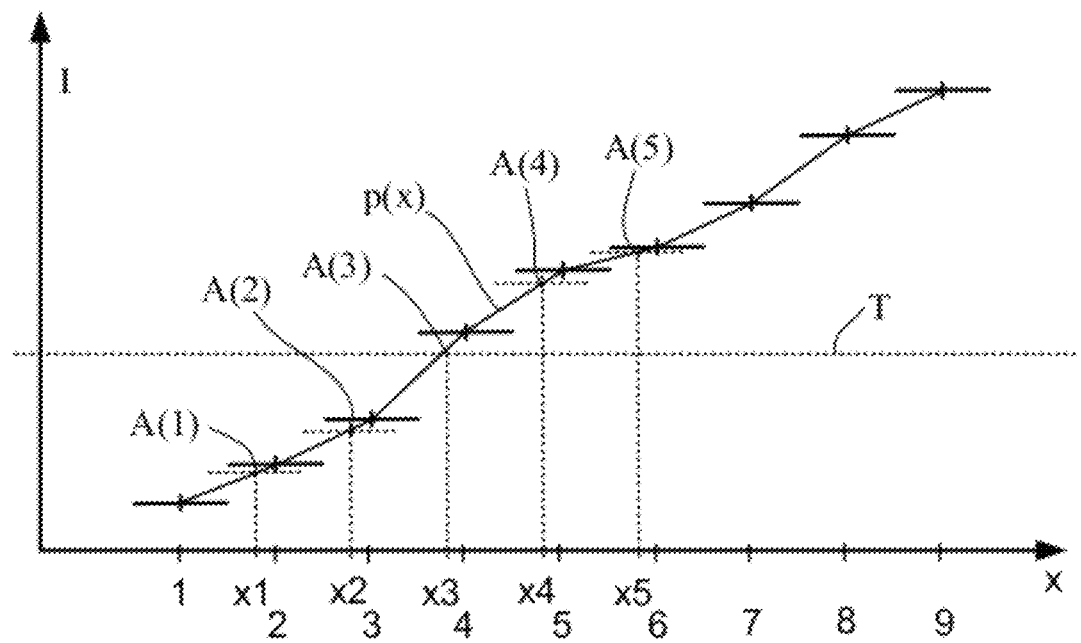

The intersection point S3 of the continuous profile function p(x) with the threshold value T is then determined. The coordinate x3 of the intersection point S3 serves as the starting point for the determination of additional analysis pixels whose distance from coordinate x3 in each case is a whole multiple of the spacing of the pixels P. Here, two additional pixels to the right and to the left are determined, as indicated in FIG. 10. The intensity values of the profile function p(x) at the thus-selected coordinates are determined, and five analysis pixels A(1)-A(5) are designated in this manner.

Figure 11:
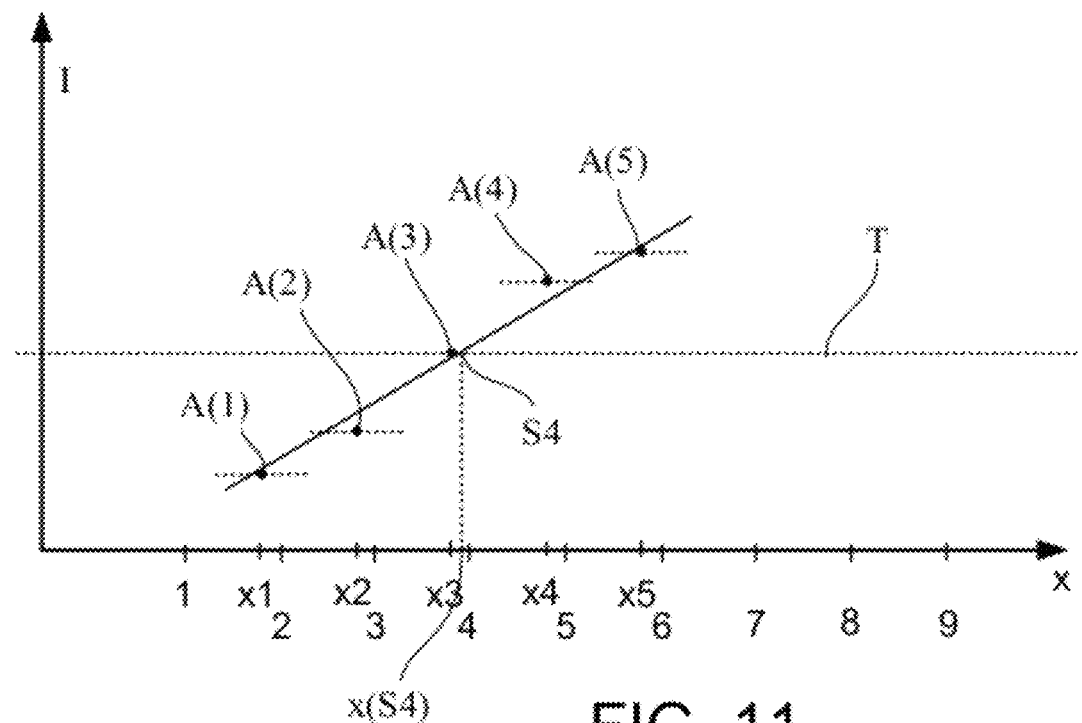

A line of best fit g3 for the analysis pixels A(1)-A(5) is determined, as is the intersection point S4 of the lines of best fit g3 with the threshold value T (FIG. 11). The coordinate x(S4) of the intersection point S4 is then used to calculate the edge position with subpixel accuracy.

Figure 12:
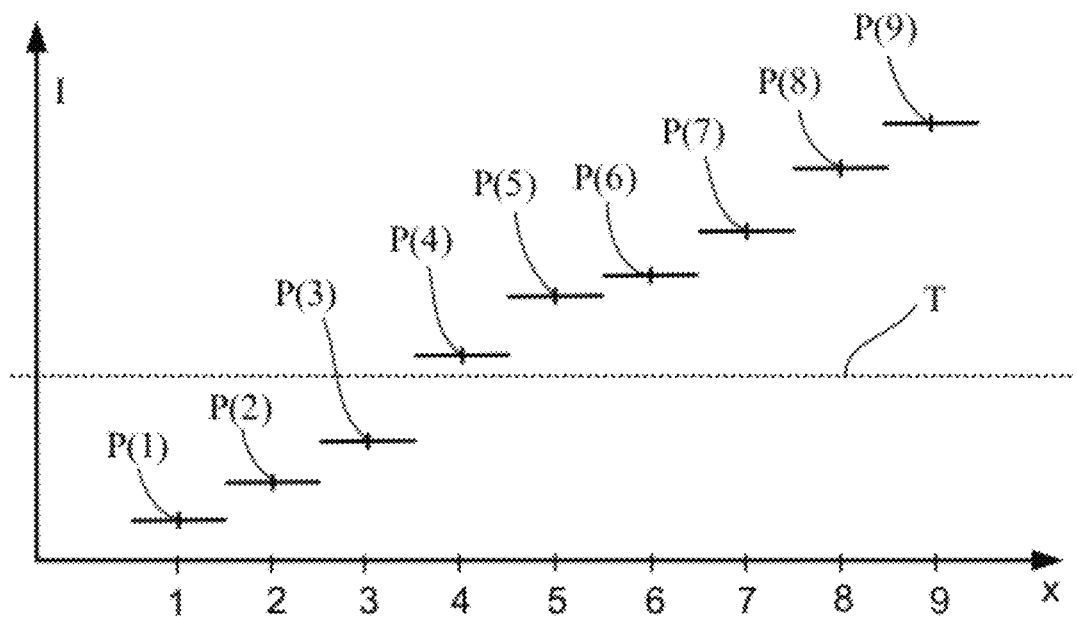
FIGS. 12-14 are graphs showing representations explaining another embodiment for subpixel-accurate position determination.
Figure 13:
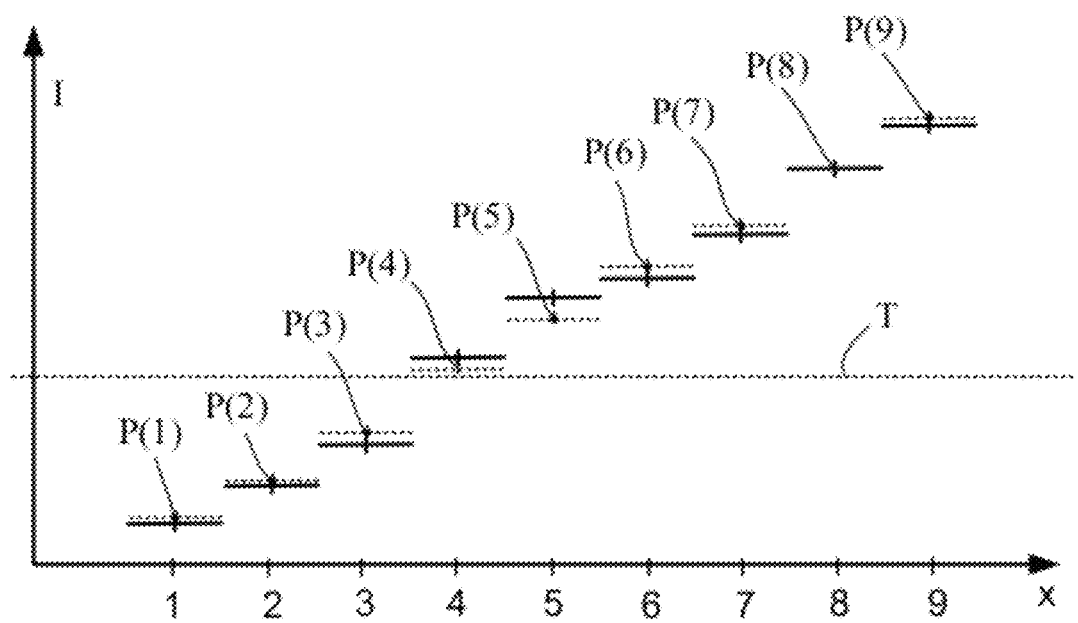

The edge position can further be determined as follows. First, from the discrete intensity of profile of FIG. 2, region C is selected (FIG. 12). The so-selected pixels P form a discrete pixel profile, which is smoothed by calculating a sliding average over, in this case, five pixels. The thus smoothed profile is illustrated in FIG. 13, the new intensity values of the individual pixels being represented as dotted lines.

Figure 14:
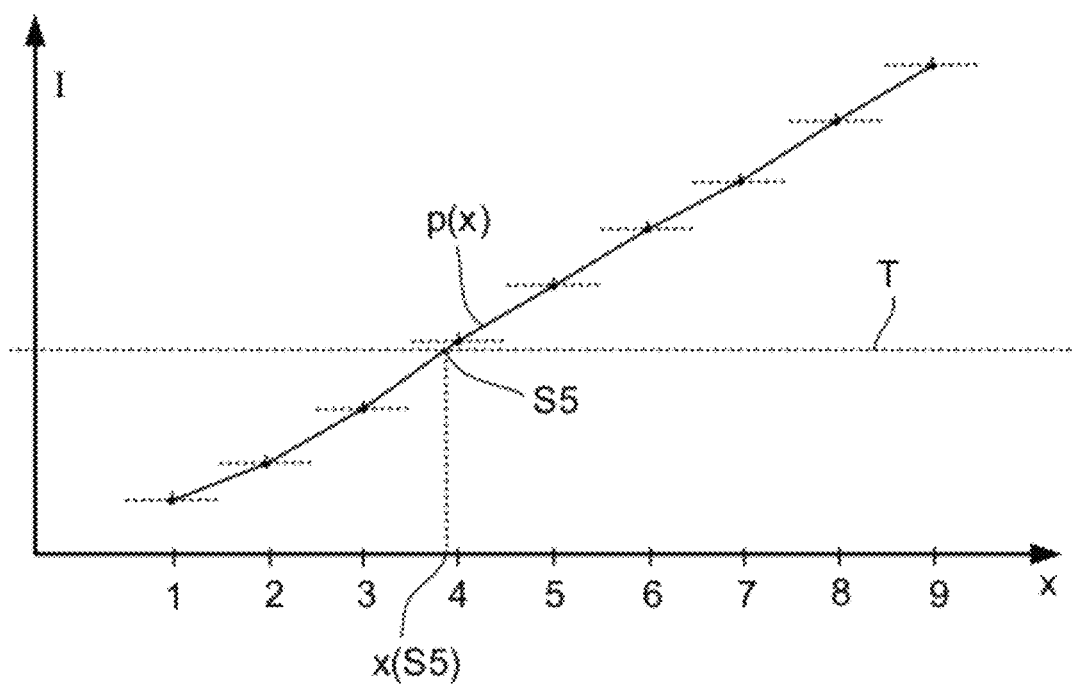

Based on the smoothed pixels P, a continuous profile function p(x) is calculated as a function of the coordinate x. The intersection point of the continuous profile function p(x) with the threshold value T is determined and the corresponding coordinate x(S5) of the intersection point S5 is then used to perform the subpixel-accurate position determination, as illustrated in FIG. 14.

Alternatively, the method disclosed in DE10047211 can be used for the edge position determination.

Various methods are available for determining the position of a region of an aerial image relative to another aerial image. The region can be cut out of the aerial image and the position determined in the other aerial image. As explained subsequently below, it may be advantageous not to cut out the region, but to mask it in the original aerial image. Its size is preserved in this way, and the position determination method is simplified if the aerial images to be compared are the same size. The region will be referred to below as image 1, and the aerial image as image 2.

In a first method, particularly when the existing image 1 and image 2 are the same size, cross-correlation is used, as disclosed in DE 10 2006 059 431 A1.

To determine the relative position of image 1 with respect to image 2, the two-dimensional correlation between image 1 and image 2 is calculated according to the following formula (1):

$$C_{m,n} = \text{Re}\left(\frac{1}{P \cdot Q} \sum_{p=1}^{P} \sum_{q=1}^{Q} \hat{a}_{p,q} \cdot b_{p,q}^* \cdot (\mu_p)^{1-m} \cdot (\nu_q)^{1-n}\right) \quad (1)$$

$$= \sum_{m'=1}^{P} \sum_{n'=1}^{Q} \hat{A}_{m',n'} \cdot B_{m'+1-m, n'+1-n}$$

Where, in the ideal case, $B_{m,n} \propto \hat{A}_{m,n}$ and the maximum occurs at m=1=n with the shifted image according to:

$$\hat{A}_{m,n} \equiv \text{Re}\left(\sum_{m=1}^{P} \sum_{n=1}^{Q} \hat{a}_{p,q} \cdot (\mu_p)^{1-m} \cdot (\nu_q)^{1-n}\right). \quad (2)$$

Image 1 and image 2 are the same size and have P rows and Q columns of pixels, the phasors being defined as follows:

$$\mu_p = e^{-2\pi i \cdot \eta_p}, p=1 \ldots P \quad (3)$$

$$\nu_q = e^{-2\pi i \cdot \xi_q}, q=1 \ldots Q \quad (4)$$

with the following coordinates $$\eta_p = \frac{p-1}{P} - \text{floor}\left(\frac{p-1}{P} + \frac{1}{2}\right) \quad (5)$$

$$\xi_q = \frac{q-1}{Q} - \text{floor}\left(\frac{q-1}{Q} + \frac{1}{2}\right). \quad (6)$$

The floor function returns the largest whole number of the argument that is less than or equal to the argument.

In a next step (Step 3), the total number of pixels ($\hat{m} \neq 1$, $\hat{n} \neq 1$) for which the correlation is maximal ($\hat{C} = C_{\hat{m},\hat{n}}$) is determined.

In the following step 4, the subpixel shift vector ($\Delta x$, $\Delta y$) is determined. Two alternatives for this step are described below.

According to a first alternative (step 4a), the so-called antisymmetry of the correlation matrix is minimized. For this purpose, with reference to a center of symmetry ($\hat{m}$, $\hat{n}$) for each pixel (m, n) and the correspondingly mirrored pixel ($2\cdot\hat{m}-m, 2\cdot\hat{n}-n$), the squared differences ($C_{m,n} - C_{2\cdot\hat{m}-m, 2\cdot\hat{n}-n}$)$^2$ are summed and are denoted as $AoC_{\hat{m},\hat{n}}$.

$AoC_{\hat{m}\pm1, \hat{n}\pm1}$ is the calculated using adjacent pixels as the center. The two-dimensional subpixel shift vector ($\Delta x \approx \hat{n}-1$, $\Delta y \approx \hat{m}-1$) is the determined by means of a parabolic fit or a parabolic interpolation near the extreme value m=$\hat{m}$, n=$\hat{n}$.

According to the second alternative (step 4b) of step 4, the correlation $C_{m,n}$ for the pixels m=$\hat{m}$, $\hat{m}\pm1$ and n=$\hat{n}$, $\hat{n}\pm1$ are used directly to determine the subpixel shift vector ($\Delta x$, $\Delta y$). In this case, the maximum of the correlation is determined by means of a parabolic fit near the extreme value m=$\hat{m}$, n=$\hat{n}$.

The subpixel deviation ($\Delta x$, $\Delta y$) determined in step 4a or 4b is added to the pre-existing shift $X_{total}$ or $Y_{total}$ (step 5) in order to calculate a new total shift $X_{total}$, $Y_{total}$:

$$x_{total} \rightarrow x_{total} + \Delta x; y_{total} \rightarrow y_{total} + \Delta y \quad (7)$$

On the first pass through step 4, the pre-existing total shift is the shift of (m, n) to (1,1). In the subsequent iteration loops, the pre-existing total shift is the total shift calculated in step 5 of the preceding iteration loop.

From this total shift, the phase tilt of the spectrum is generated by multiplication (Step 6):

$$\hat{a}_{p,q} \equiv a_{p,q} \cdot (\mu_p)^{-y_{total}} \cdot (\nu_q)^{-x_{total}} \quad (8)$$

A check is then performed to determine whether the subpixel shift ($\Delta x$, $\Delta y$) is less than a predetermined maximum value (step 7). If this is not the case, the correlation $C_{m,n}$ is calculated according to the above formula 1 with the phase tilt according to formula 8 (step 8), which is equivalent to shifting the two images, image 1 and image 2, relative to each other by the total shift determined in step 5.

Steps 4-7 are then repeated, although it is no longer necessary for the shift to be a full pixel shift (step 3). In the re-performed step 6, the new total shift is re-applied to image 2. In terms of result, this is the same as shifting the already shifted image 2 only by the recalculated subpixel shift vector. Formula (7) is to be replaced by the following formula (7') in this case:

$$\Delta x_{total} = \Delta x, y_{total} = \Delta y \quad (7')$$

Steps 8 and 4-7 are repeated until the subpixel shift in step 7 is found to be smaller than a defined threshold value.

If this is the case, no further iterations are performed, and, in step 9, the total shift or total image distance ($x_{total}$, $y_{total}$) between the two images, image 1 and image 2, is output.

To determine the position of image 1 (a region of an aerial image) relative to image 2 (another aerial image), in a further inventive method the method of least squares is used. This mathematical method is advantageous because, unlike the preceding mathematical method, it can be employed even when discontinuities are present in the intensity distribution of the edge region of image 1. As a result, it is possible not only to select regions that encompass an entire feature, but also to select regions that include, for example, an edge of a feature. In image 1, the selected region of the aerial image is masked. All the image data outside the masked region are suppressed during the position determination. Image 1 and image 2 thus remain the same size. Plural regions, for example plural edges of a feature, can also be masked in image 1.

The position is determined by the least squares method, image 1 being shifted cyclically in relation to image 2 and the sum of the squared differences between the intensities in the two images, image 1 and image 2, being calculated for each shifted position across all the image dots. Summing the squared differences between the intensities in image 1 and image 2 across all the image dots is equivalent to overlaying the two images, image 2 being stationary and image 1 being shifted.

The term "cyclic shift" is understood here to mean that the image data from the first image, image 1, which during the shift are shifted outside the image edge of the second image, image 2, are shifted back into the respective opposite image edge side of image 2.

The shifted position is sought at which the above-described weighted sum, which will be referred to below as the optimization function, assumes an extreme value (maximum or minimum). The shifted position present at this extreme value is the sought position of image 1 relative to image 2.

An optimization function $M(x,y)$ can be represented, for example, by the following formula (1a):

$$M(x,y) = -\sum_{m=0}^{P-1}\sum_{n=0}^{Q-1} K_{m,n}\cdot [A_{m,n}(x,y)-B_{m,n}]^2 \xrightarrow{(x,y)} \text{maximum} \tag{1a}$$

where $K_{m,n}$, the normalized 2D masking (also referred to hereinafter as keyhole masking or keyhole apodization), with $$\sum_{m=0}^{P-1}\sum_{n=0}^{Q-1} K_{m,n} = 1.$$

$A_{m,n}(x,y)$ represents the image 1 to be shifted, which has been shifted by a vector $(-x,-y)$, and $B_{m,n}$ denotes the stationary image 2. Both captured images are the same size and each contains P×Q pixels. Both captured images are matrices composed of P×Q pixels of the same size. In a variant of the exemplary embodiment, P=Q=1000. This corresponds to the matrix of pixels of the detector 6 of the position measuring device 10. The intensity values of the two captured images that can be found at the same pixel position in both captured images (taking the shift $(-x,y)$ into account) are constantly subtracted from each another by the summation.

Since $B_{m,n}$ is not shifted and therefore does not depend on the shift vector $(-x,-y)$, the optimization function can be rewritten as follows:

$$M(x,y) = \sum_{m=0}^{P-1}\sum_{n=0}^{Q-1} K_{m,n}\cdot [2\cdot A_{m,n}(x,y)\cdot B_{m,n} - A_{m,n}(x,y)^2] \xrightarrow{(x,y)} \text{maximum} \tag{2a}$$

If a spectral decomposition is performed for image 1 and image 2, formula 2a can be written as follows:

$$M(x,y) = \frac{1}{P\cdot Q}\sum_{p,q} \overbrace{[2\cdot a_{p,q}\cdot \beta^*_{p,q} - \alpha_{p,q}]}^{=Kernel_{p,q}} \cdot e^{2\pi i(x\cdot \xi_q + y\cdot \eta_p)} \xrightarrow{(x,y)} \text{maximum} \tag{3a}$$

where the asterisk (*) here means that the quantity concerned is a complex conjugate value.

For the above Formula 3a, the following spectral decompositions are performed:

$$A_{m,n}(x,y) = \frac{1}{P\cdot Q}\sum_{p,q} a_{p,q}\cdot e^{2\pi i([n+x]\cdot \xi_q + [m+y]\cdot \eta_p)} \tag{4a}$$

$$A_{m,n}(x,y)^2 = \frac{1}{P\cdot Q}\sum_{p,q}\alpha_{p,q}\cdot e^{2\pi i([n+x]\cdot \xi_q + [m+y]\cdot \eta_p)} \tag{5a}$$

$$K_{m,n}\cdot B_{m,n} = \frac{1}{P\cdot Q}\sum_{p,q}\beta_{p,q}\cdot e^{2\pi i(n\cdot \xi_q + m\cdot \eta_p)} \tag{6a}$$

$$K_{m,n} = \frac{1}{P\cdot Q}\sum_{p,q}\kappa_{p,q}\cdot e^{2\pi i(n\cdot \xi_q + m\cdot \eta_p)} \tag{7a}$$

In addition, $a_{p,q}$ denotes the following spectral folding:

$$\alpha_{p,q} \equiv (a\otimes a)_{p,q} = \frac{1}{P\cdot Q}\sum_{p',q'} a_{p-p',q-q'}\cdot a_{p',q'} \tag{8a}$$

and the functions $\xi_q$, $\eta_p$ are defined according to the following formulas 9a and 10a:

$$\xi_q = \frac{q}{Q} - \text{floor}\left(\frac{q}{Q}+\frac{1}{2}\right); q=0\ldots Q-1 \tag{9a}$$

$$\eta_p = \frac{p}{P} - \text{floor}\left(\frac{p}{P}+\frac{1}{2}\right); p=0\ldots P-1 \tag{10a}$$

The floor function returns the largest whole number of the argument that is smaller than or equal to the argument. In this way, the relative position of image 1 with respect to image 2 can be determined numerically with high accuracy.

Due to the weighted summation according to the above-cited optimization function, a hard edge is incorporated into the overlay, but this does not eliminate bandwidth limitation from the spectral decomposition. Thus, in the difference according to the kernel$_{p,q}$ in formula 3a, even though neither $\beta^*_{p,q}$ nor $\kappa_{p,q}$ is bandwidth-limited, both the minuend and the subtrahend are bandwidth-limited, since $a_{p,q}$ and $\alpha_{p,q}$ are spectral bandwidth-limited. Due to the folding according to formula 8, $\alpha_{p,q}$ does have a larger spectral region than $a_{p,q}$ but it is still spectral band-limited. It is therefore possible to obtain a numerical solution to formula 3a that is very accurate. For the rest, the subtrahend α·κ* can be viewed as a term that balances the effect of the leading cross-correlation term 2a·β*. Hence, intensity inhomogeneities can be present on the edge trajectory of the weighting and the inventive method will still yield the relative position being sought. In conventional correlation methods, for example of the kind described in DE 10 2007 033 815 A1, edge inhomogeneities of this kind make it impossible to obtain meaningful results.

Not all of the shifted positions have been found to yield meaningful results, since the optimization function often has several local maxima or minima. Consequently, for example the relative position of image 1 with respect to image 2 or a portion thereof is determined relatively coarsely by correlation methods, as described above. Such relatively coarse position determination is understood here particularly to include pixel-accurate determination. This relative position shift is then used as the starting value for the optimization function, to ensure that the extreme value that is then found is also the sought local extreme value of the optimization function.

Other parameters can also be taken into account in this least squares method with weighting. For example, the disparate image control of the two images can be taken into account by means of a further parameter S, as given in the following formula 11a. This is necessary, for example, if the intensity values of the images to be compared, image 1 and image 2, are not normalized to a reference intensity. Further additionally, a brightness offset between the two images, due to stray light, for example, can also be taken into account, as expressed by parameter T in formula 12a. These formulas 11a and 12a can be represented spectrally, as described earlier hereinabove, and can thus be well solved numerically.

$$M(x, y, S) = -\sum_{m=0}^{P-1}\sum_{n=0}^{Q-1} K_{m,n} \cdot [A_{m,n}(x, y) - S \cdot B_{m,n}]^2 \xrightarrow{(x,y),S} \text{maximum} \quad (11a)$$

$$M(x, y, S, T) = \\ -\sum_{m=0}^{P-1}\sum_{n=0}^{Q-1} K_{m,n} \cdot [A_{m,n}(x, y) - S \cdot B_{m,n} - T]^2 \xrightarrow{(x,y),S,T} \text{maximum} \quad (12a)$$

The optimization function M according to formulas 11a and 12a can, in turn (as in formula 3a), be represented as follows:

$$M(x, y) = \frac{1}{P \cdot Q} \sum_{p,q} \text{Kernel}_{p,q} \cdot e^{2\pi i(x \cdot \xi_q + y \cdot \eta_p)}, \quad (13a)$$

only the kernel$_{p,q}$ being different. For formula 11a, the kernel$_{p,q}$ is stated as follows:

$$\text{Kernel}_{p,q} = -\alpha_{p,q} \cdot \kappa^*_{p,q} + ((a \cdot \hat{\beta}^*) \otimes (a \cdot \hat{\beta}^*))_{p,q} \quad (14a)$$

the following abbreviated notation being used here in addition to the abbreviations stated above:

$$\hat{B}_{m,n} \equiv B_{m,n} / \sqrt{\sum_{m',n'} K_{m',n'} \cdot B^2_{m',n'}} \quad (15a)$$

$$\hat{\beta}_{p,q} \equiv \sum_{m,n} K_{m,n} \cdot \hat{B}_{m,n} \cdot e^{-2\pi i(n \cdot \xi_q + m \cdot \eta_p)} \quad (16a)$$

The kernel$_{p,q}$ for formula 12a is thus represented as follows:

$$\text{Kernel}_{p,q} = -\alpha_{p,q} \cdot \kappa^*_{p,q} + ((a \cdot \hat{\beta}^*) \otimes (a \cdot \hat{\beta}^*))_{p,q} + ((a \cdot \kappa^*) \\ \otimes (a \cdot \kappa^*))_{p,q} \quad (17a)$$

the following abbreviated notation being used here in addition to the abbreviations stated above:

$$\tilde{B}_{m,n} \equiv \frac{B_{m,n} - \left(\sum_{m',n'} K_{m',n'} \cdot B_{m',n'}\right)}{\sqrt{\left(\sum_{m',n'} K_{m',n'} \cdot B^2_{m',n'}\right) - \left(\sum_{m',n'} K_{m',n'} \cdot B_{m',n'}\right)^2}} \quad (18a)$$

$$\tilde{\beta}_{p,q} \equiv \sum_{m,n} K_{m,n} \cdot \tilde{B}_{m,n} \cdot e^{-2\pi i(n \cdot \xi_q + m \cdot \eta_p)} \quad (19a)$$

The kernel$_{p,q}$ in formula 14a for M(x,y,S) according to formula 11a can be determined by setting the partial derivative of the optimization function M(x,y,S) after S to zero, solving this equation after S and inserting it into formula 11a, such that the optimization for parameter S is already included in the kernel statement.

In the same way, the kernel$_{p,q}$ in formula 17a can be determined for formula 12a by deriving the optimization function M(x,y,S,T) once partially to S according to formula 12a and setting the derivative to zero and deriving it once partially to T and setting the derivative to zero, and inserting the thus-determined equations for S and T into formula 12a.

Figure 20:
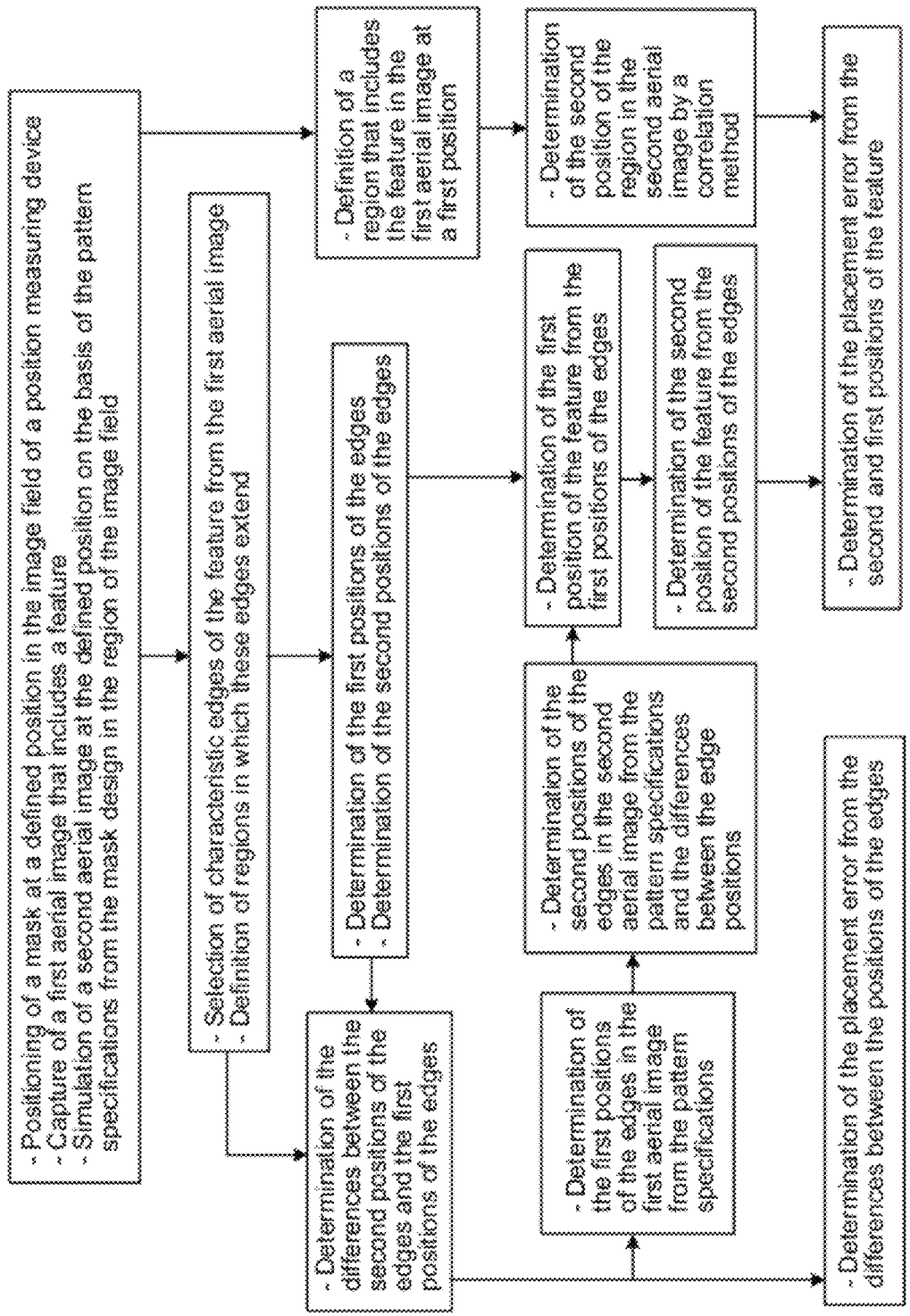
FIG. 20 is a flow chart of an exemplary embodiment of the method according to the invention.

A flow chart of the method according to the invention for determining the registration error is illustrated in FIG. 20. To determine a registration error of a feature, a first aerial image that includes a feature is taken at a defined position P1 on the mask. Position P1 gives the location of the origin of the image field of the position measuring device 10 in the mask coordinate system, which, as noted earlier, is at the center of the image field. Thus, the origin of the first aerial image is likewise located at the center thereof. The dimensions of the aerial image correspond to the image field on the mask.

The simulation of the second aerial image is based on the pattern specifications of the mask (the mask design) at position P1, corresponding to the dimensions of the image field or first aerial image.

In a variant of the method, the position of the feature is defined by the positions of characteristic edges of the feature. The characteristic edges are defined as regions in the first (or second) aerial image. This is performed by the user at a video monitor (not shown in FIG. 1) which is part of the control unit 7 and which displays the aerial images. An example will be provided farther below with reference to FIG. 18a. The positions of the defined regions are given in the coordinate system of the aerial images. The first positions of the edges, determined according to the aforementioned threshold value method, are also given in the coordinate system of the aerial image. Since the registration errors to be expected are small, the same regions are used for position determination in the second (first) aerial image as in the first (second) aerial image.

Based on the distances of the second positions of the edges in the second (first) aerial image from the first positions of the edges in the first (second) aerial image, the registration errors of the edges are determined in the coordinate system of the aerial images, but can be converted directly to the mask coordinate system. If the registration errors of plural edges are determined, these are used to determine a resulting registration error of the feature.

To determine a registration error of a feature from plural edge positions, in a variant of the method, from the positions of the edges in an aerial image, a characteristic point of the feature, such as its center of symmetry, for example, is selected as the position of the feature. A method for determining the center of symmetry of a cross composed of bars is given farther below, and this method can also be used generally for suitable features. The first position of the feature is determined in the first aerial image and the second position of the feature is determined in the second aerial image. The registration error is then calculated as the difference between the coordinates of the second position and the coordinates of the first position.

The aforesaid correlation method can also be used on the basis of the edges defined in the first (second) aerial image. In this case, the position of the region of an edge in the second (first) aerial image is determined. The positions are then compared by means of defined points, such as, for example, the centers of the regions. Based on the distances of the centers of the regions in the first aerial image from the centers of the regions in the second aerial image, the registration error of an edge is determined initially in the coordinate system of the aerial images, but can be converted directly to the mask coordinate system. From the registration errors of the edges, the registration error of the features can be determined. To accomplish this, the registration errors of the edges and the positions of the edges as specified in the design are used to calculate the second positions of the edges (the actual positions). From these second positions, as explained above, the first position of the feature is then determined. The first position of the feature is determined analogously from the edge positions given in the pattern specifications.

In a variant of the method, plural regions of edges of a feature can simultaneously be correlated with the second aerial image. For this purpose, as described above, the regions of the edges of interest are masked in the second aerial image.

In a variant of the method, in the first (second) aerial image, the region of an entire feature whose registration error is to be determined is defined. The position of the region in the second (first) aerial image is then determined. The positions are then compared on the basis of a defined point in the regions, such as their centers, for example. Based on the deviation of the coordinates of the center of the region in the first aerial image from the coordinates of the center of the region in the second aerial image, the registration error is determined initially in the coordinate system of the aerial images, but can be converted directly to the mask coordinate system.

Figure 15A:
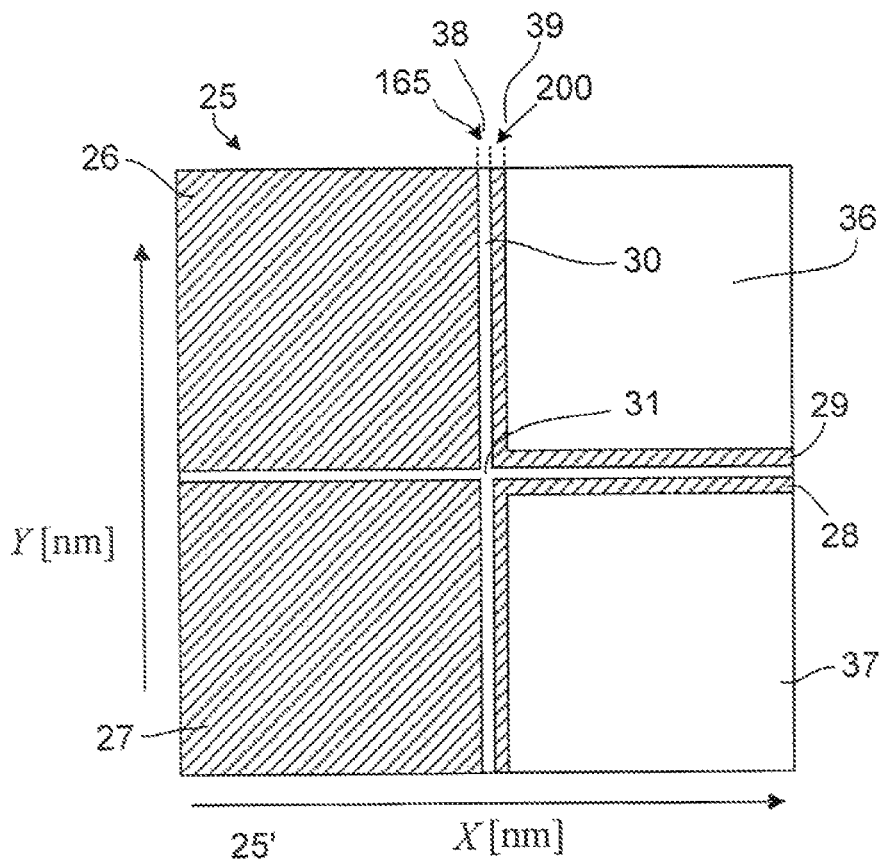
FIG. 15a shows a mask pattern of a first example for determining registration errors.
Figure 15B:
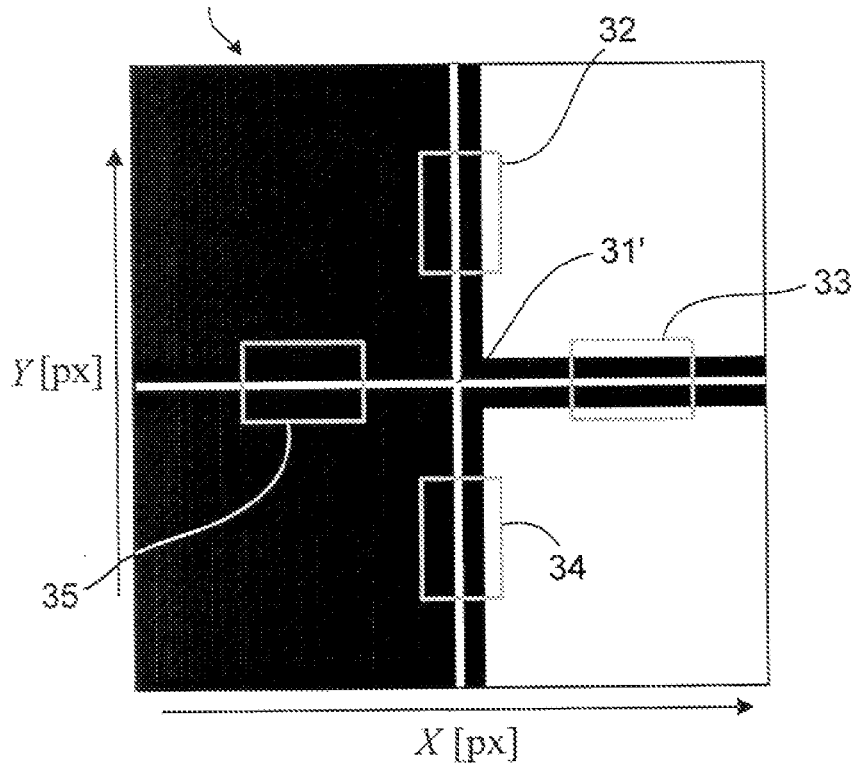
FIG. 15b shows an aerial image of the first example for determining registration errors.

The determination of registration errors will be explained with reference to a first example of a cross with an asymmetrical environment. The value to be determined is the registration error of an intersection point 31 of two bars forming a cross 30. The mask pattern is illustrated in FIG. 15a; hatched regions 26, 27, 28, 29 are non-transmitting or non-reflecting regions of the mask. In a conventional transmissive mask, the hatched regions are coated with chromium. A nearly white cross 30 composed of two bars of the same width, which form four sections, is adjacent, by four edges of the bars, to two black squares. The other four edges of the bars are adjacent to four nearly black bars 28, 29 that are adjacent to white squares 36, 37. The resulting first or second aerial image 25' is illustrated in FIG. 15b. The lighter the shade of gray, the higher the intensity of the particular region or pixel.

To determine the position of the intersection point 31 of the cross 30, first, the positions of the eight long edges of the four sections of the cross 30 are determined. Eight regions of interest (ROIs) 32 to 35 are defined for this purpose by the user, as illustrated in FIG. 2. The regions of interest are defined in either the first or the second aerial image. The edge position determination is performed on both the first and the second aerial image. The two regions 33, 35 in the x-direction serve to determine the position of the bar in the y-direction. The two regions 32, 34 in the y-direction serve to determine the position of the bar in the x-direction. For the regions in the x-direction, an edge profile in the y-direction is determined by calculating the average of all the intensity values in the x-direction. Each edge profile receives the profiles of two opposite edges of a section of the bars, which are selected during the determination. From the edge profiles, the positions of the edges in the y-direction are determined with subpixel accuracy according to the above-described threshold value method. The threshold value is, for example, 70% of the maximum intensity in the aerial image. An analogous procedure is used to determine the positions of the edges in the x-direction. From the positions of the eight edges, the center 31 of the cross 30 can now be determined by statistical or geometrical calculation. The distance between the two center points 31 determined in the first and second aerial images 25 is the registration error.

The following method can be used to determine the position of the center 31 of the cross 30. The directions of extent of the edges are taken from the pattern specifications of the mask. The orientation of the edges is ascertained by means of the determined edge positions. The tangent equations of the edges are therefore known. All the edges so defined form a region around the center 31 of the cross 30. The center is now calculated by the least squares method in such a way that its shortest distances from all the tangents become minimal in the sum of the squares.

Figure 16:
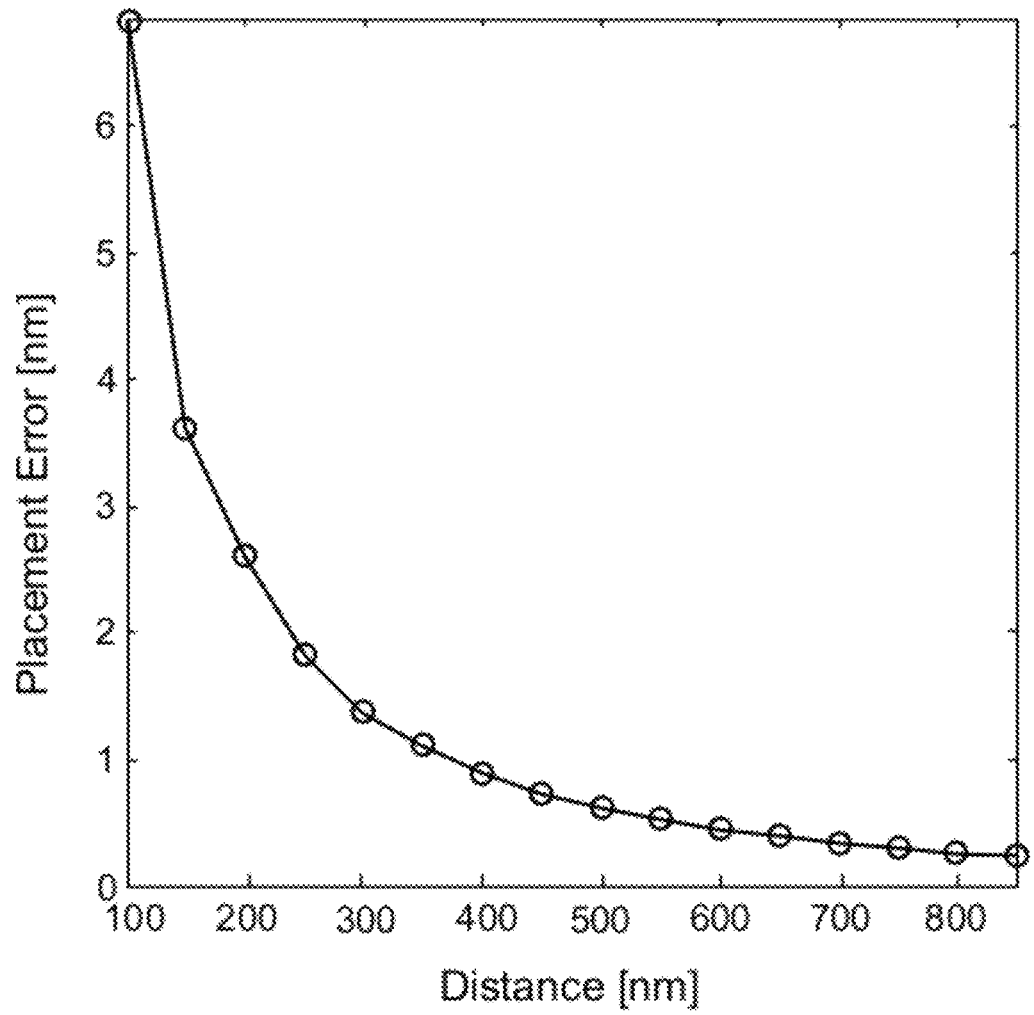
FIG. 16 is a graph of registration errors introduced as artifacts by proximity effects in the first example.

To clarify the falsification of positions by proximity effects, aerial images of various embodiments of the mask 25 were simulated. The width 39 of each non-transmissive region 28, 29 of the mask located adjacent a respective square transmissive region 36, 37 was varied. The width 39 of the perpendicularly disposed leg of regions 28, 29 is constant. In the drawing, this is defined as 200 nm. The line width of the cross 38 on the mask has a constant value of 165 nm. The distance of the square regions 36, 37 from the cross 30 is therefore varied. The registration error of the center of the cross 30 that is introduced as an artifact by the proximity effects in the y-direction is negligible, since the environment is symmetrical in this direction. In the x-direction, however, the proximity effects are considerable. FIG. 16 illustrates the false registration error as a function of the distance, i.e., the width of the leg of the non-transmissive regions 28, 29. With a distance of 100 nm, the false registration error is 6.5 nm; with a distance of, for example, 400 nm, it is 0.8 nm. The false registration error tends toward zero with increasing distance between the transmissive regions.

Figure 17:
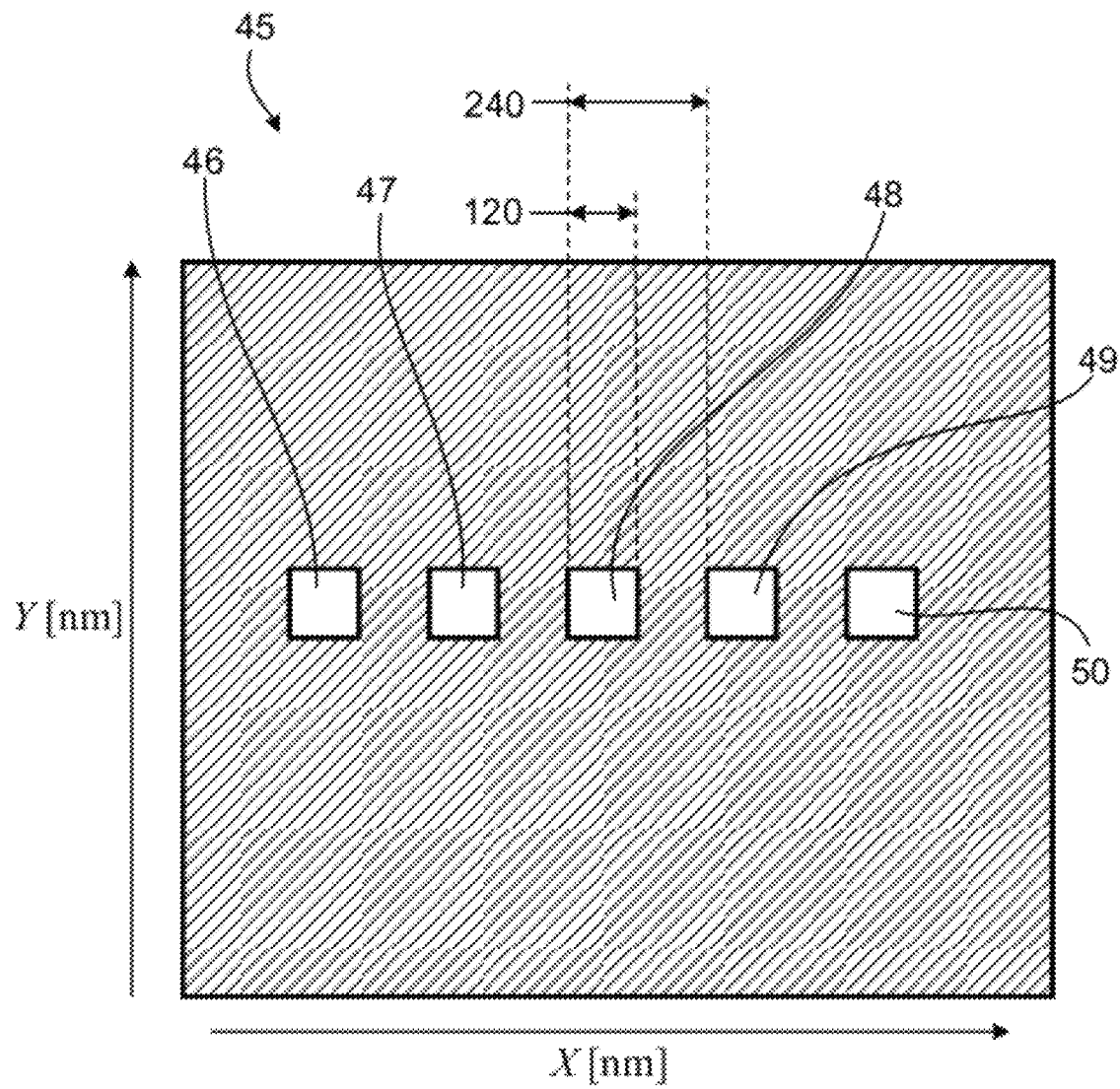
FIG. 17 shows a mask pattern of a second example for determining registration errors.

In a second example, the centers of symmetry of pinholes are determined. The mask pattern specifications include five square pinholes arranged in a straight line in the x-direction. The mask pattern is illustrated in FIG. 17. The edge length of the pinholes is 120 nm; the distance between pinholes is 240 nm. The first and second aerial images of the mask are shown in FIGS. 18a and 18b, respectively.

Figure 18A:
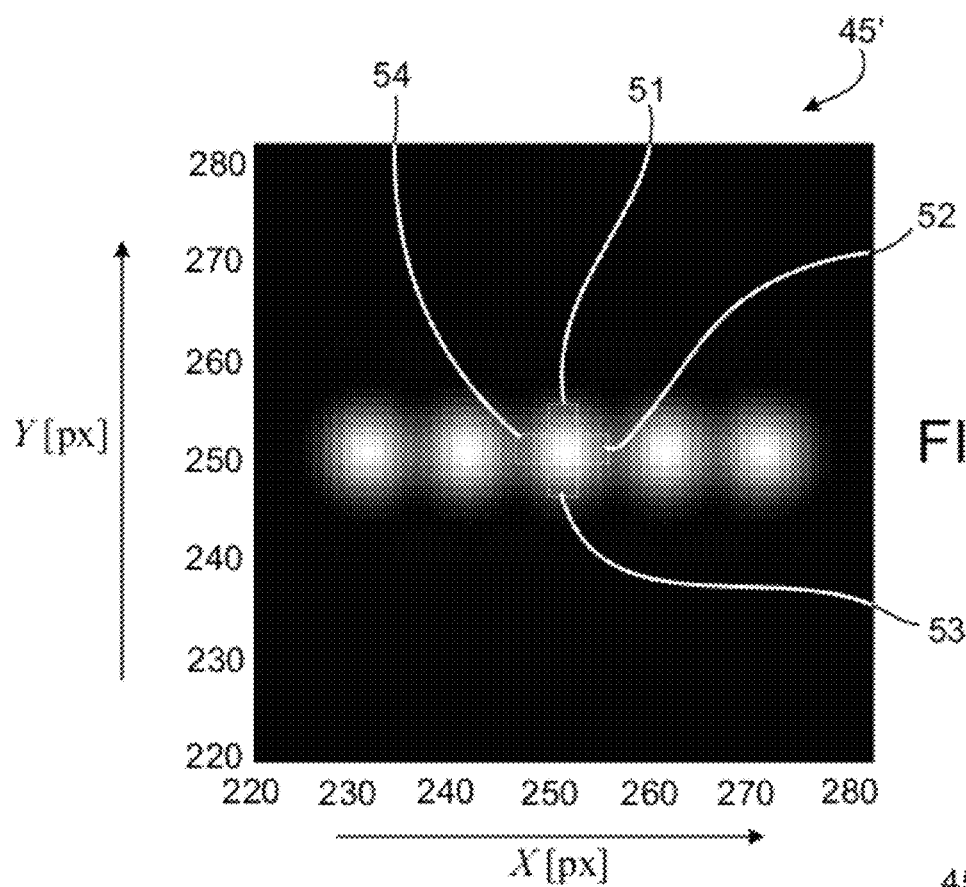
FIGS. 18a and 18b are aerial images of the second example for determining registration errors.
Figure 18B:
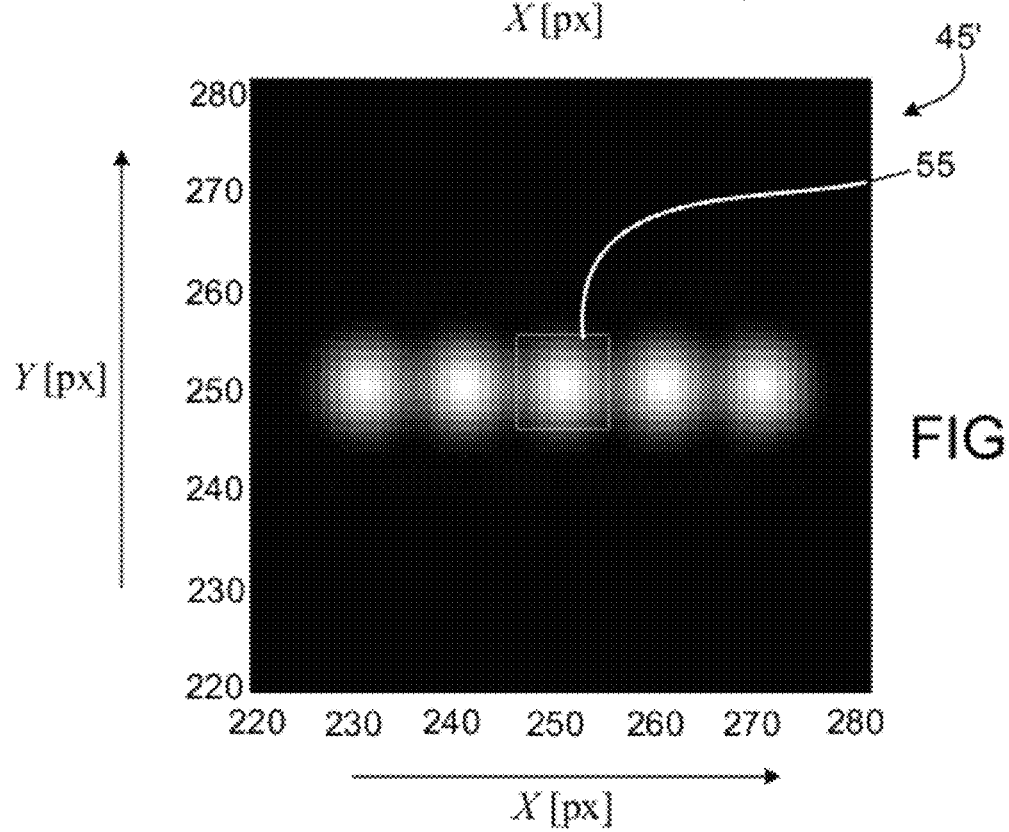

The determination of the positions of the centers of symmetry of the pinholes 46 to 50 is illustrated taking the example of the central pinhole 48 in FIGS. 18a and 18b. The positions of the four edges of the pinhole can be determined. For this purpose, four regions 51 to 54 of the particular edges are selected from the aerial image 45', as illustrated in FIG. 18a, and the positions are determined by the threshold value method as explained above. The lighter the shade of gray depicted in the aerial image, the higher the intensity of the particular region or pixel. From the positions of the four edges, the position of the center of symmetry of the pinhole is then calculated using simple geometrical calculations. To do this, for the x-position of the center of symmetry, the average of the two determined x-values of the edges extending in the y-direction is calculated. For the y-position of the center of symmetry, the average of the two determined y-values of the edges extending in the x-direction is calculated. The position of the center of symmetry of the pinhole is determined by the same method for the other aerial image. The difference between the respective locations of the centers of symmetry is the registration error.

The differences between the positions of the edges can also be determined by the above-cited correlation method. The registration error can also be calculated directly from the differences between the edge positions. For this purpose, the average registration error is calculated in the x-direction and the y-direction, respectively.

It is also possible, however, to use the edge positions from the mask pattern specifications to calculate the nominal position of the center of symmetry of the pinhole, as explained above. The actual positions of the edges are calculated from the nominal positions of the edges and the registration errors of the edge positions. From the nominal positions of the edges, the nominal position of the center of symmetry of the pinhole is then calculated as described. The registration error is then calculated, as described above, as the difference between the positions of the centers of symmetry.

The position of a center of symmetry of a pinhole is also determined by determining the position of the pinhole from one aerial image in the other aerial image. To do this, region 55 of the pinhole is selected in one aerial image, as illustrated in FIG. 18b. The position of this region in the other aerial image is then determined as explained above. The difference between the positions corresponds to the registration error.

Figure 19A:
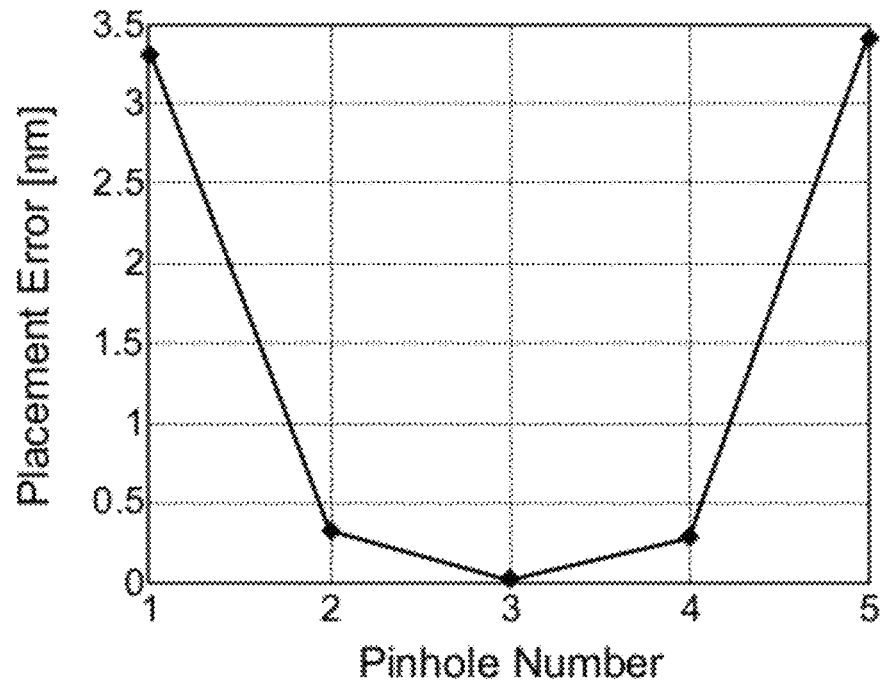
FIG. 19 are graphs of registration errors introduced as artifacts by proximity effects in the second example.
Figure 19B:
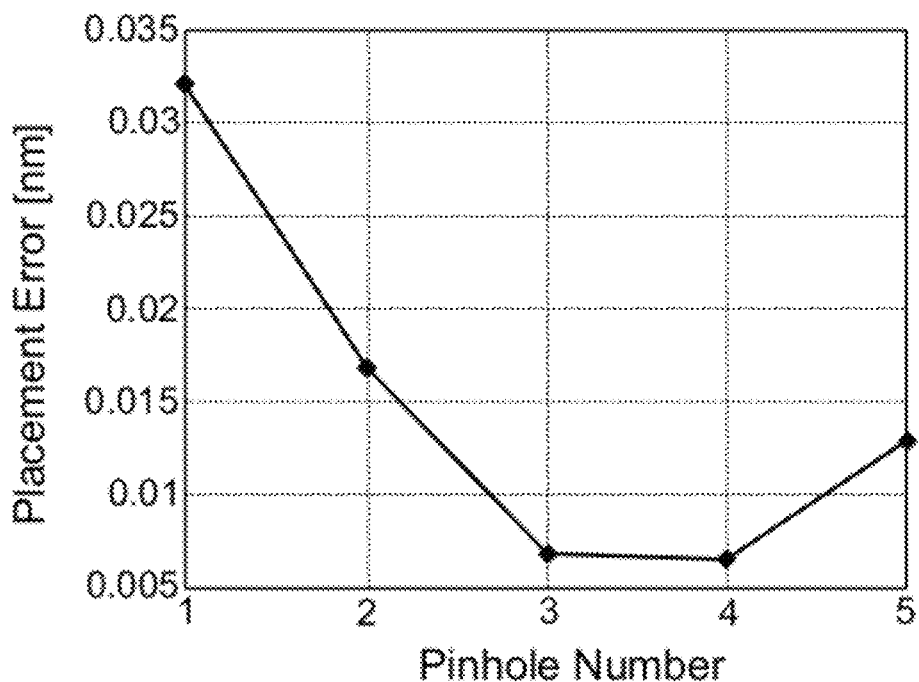

The influence of proximity effects on registration error measurement has been investigated with regard to this example, as well. It was found that registration errors in the x-direction introduced as artifacts by proximity effects are more pronounced in the case of pinholes having an asymmetrical proximity environment. FIG. 19a is a graph of the false registration errors for each of the five pinholes 46 to 50. These have been numbered (in the same order) 1 to 5 in the x-direction. For the middle pinhole 48 (number 3), the false registration error is nearly zero; it increases to 3.2 nm for the outermost pinholes 46 and 50 (numbers 1 and 5). The proximity effects in the y-direction are negligible, as can be seen from the graph of FIG. 19b.

The features described above related to processing of data can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method for determining a registration error of a feature on a mask, the registration error indicating a deviation of a nominal position of the feature from its actual position on the mask the method comprising:
   providing a first aerial image that was captured by a position measuring device and includes at least said feature, said feature comprising a registration pattern or marker,
   simulating, from pattern specifications of the mask, a second aerial image that includes at least said feature, taking into account at least one effect that causes distortion of said first aerial image, and
   determining the registration error of said feature as the distance of the position of said feature in said first aerial image from the position of said feature in said second aerial image;
   wherein said second aerial image is simulated, on the basis of the pattern specifications of the mask, as a transmission function that has, at least in part, a higher resolution than said first aerial image.

2. The method according to claim 1, wherein at least one of the following effects is taken into account in the simulation of said second aerial image: proximity effects, distortion due to an objective lens of the position measuring device, topography of the mask, and refractive index of the mask.

3. The method as in claim 1, wherein the simulation of said second aerial image is based on pattern specifications of the mask that are in the form of a continuous transmission function, said second aerial image being determined as a matrix of discrete intensity values, a discretization of the spectrum of the mask being performed without further approximation.

4. The method as in claim 1, wherein at least one region of said feature is defined that will be taken into account in determining the distance.

5. The method as in claim 4, wherein said at least one region of said feature is embodied as an edge of said feature.

6. The method as in claim 1, comprising:
   designating, in said first and said second aerial image, at least one region of said feature that is to be taken into account in determining the registration error,
   determining the at least one first and second position of said at least one region, and
   determining the distance on the basis of said at least one first and second positions of said at least one region in said aerial images.

7. The method as in claim 6, wherein said at least one region is embodied as at least one edge of said feature, said at least one position of said edge being determined by a threshold value method.

8. The method as in claim 7, comprising:
   determining a first position of said feature in said first aerial image from said at least one first position of an edge,
   determining a second position of said feature in said second aerial image from said at least one second position of an edge, and
   determining the distance as the difference between said first position and said second position.

9. The method as in claim 1, comprising:
   designating at least one region in said first or second aerial image, determining a position of said region in the other said aerial image, and
  determining the distance on the basis of the at least one difference between the positions of said at least one region in said aerial images.

10. The method as in claim 9, wherein the position of said at least one region is determined by the least squares method.

11. The method as in claim 9, wherein said at least one designated region is masked, all image data of the aerial image outside the masked region being suppressed.

12. The method as in claim 9, wherein said one region includes said feature.

13. The method as in claim 1, wherein a first position of said at least one edge is adopted as the nominal position from the pattern specifications of the mask, and a second position of said edge is determined as the actual position from the pattern specifications of the mask and from the difference between the positions of said at least one region in said aerial images.

14. A position measuring device for determining a registration error of a feature on a mask, which device comprises a control unit that performs a method for determining a registration error of a feature on a mask, the registration error indicating a deviation of a nominal position of the feature from its actual position on the mask, the method comprising:
  providing a first aerial image that was captured by a position measuring device and includes at least said feature, said feature comprising a registration pattern or marker,
  simulating, from pattern specifications of the mask, a second aerial image that includes at least said feature, taking into account at least one effect that causes distortion of said first aerial image, and
  determining the registration error of said feature as the distance of the position of said feature in said first aerial image from the position of said feature in said second aerial image, in which the second aerial image is simulated, on the basis of the pattern specifications of the mask, as a transmission function that has, at least in part, a higher resolution than the first aerial image.

15. The position measuring device of claim 14 in which at least one of the following effects is taken into account in the simulation of the second aerial image: proximity effects, distortion due to an objective lens of the position measuring device, topography of the mask, and refractive index of the mask.

16. The position measuring device as in claim 14 in which the simulation of the second aerial image is based on pattern specifications of the mask that are in the form of a continuous transmission function, the second aerial image being determined as a matrix of discrete intensity values, a discretization of the spectrum of the mask being performed without further approximation.

17. The position measuring device as in claim 14 in which at least one region of the feature is defined that will be taken into account in determining the distance.

18. The position measuring device as in claim 17 in which the at least one region of the feature is embodied as an edge of the feature.

19. The position measuring device as in claim 14 in which the method performed by the control unit comprises:
  designating, in the first and the second aerial image, at least one region of the feature that is to be taken into account in determining the registration error,
  determining the at least one first and second position of the at least one region, and
  determining the distance on the basis of the at least one first and second positions of the at least one region in the aerial images.

20. The position measuring device as in claim 19 in which the at least one region is embodied as at least one edge of the feature, the at least one position of the edge being determined by a threshold value method.

21. The position measuring device as in claim 20 in which the method performed by the control unit comprises:
  determining a first position of the feature in the first aerial image from the at least one first position of an edge,
  determining a second position of the feature in the second aerial image from the at least one second position of an edge, and
  determining the distance as the difference between the first position and the second position.

22. The position measuring device as in claim 14 in which the method performed by the control unit comprises:
  designating at least one region in the first or second aerial image,
  determining a position of the region in the other the aerial image, and
  determining the distance on the basis of the at least one difference between the positions of the at least one region in the aerial images.

23. The position measuring device as in claim 22 in which the position of the at least one region is determined by the least squares method.

24. The position measuring device as in claim 22 in which the at least one designated region is masked, all image data of the aerial image outside the masked region being suppressed.

25. The position measuring device as in claim 22 in which the one region includes the feature.

26. The position measuring device as in claim 14 in which a first position of the at least one edge is adopted as the nominal position from the pattern specifications of the mask, and a second position of the edge is determined as the actual position from the pattern specifications of the mask and from the difference between the positions of the at least one region in the aerial images.

27. A method for determining a registration error of a feature on a mask, the registration error indicating a deviation of a nominal position of the feature from its actual position on the mask, the method comprising:
  providing a first aerial image that was captured by a position measuring device and includes at least said feature, said feature comprising a registration pattern or marker,
  simulating, from pattern specifications of the mask, a second aerial image that includes at least said feature, taking into account at least one effect that causes distortion of said first aerial image,
  designating at least one region in said first or second aerial image,
  determining a position of said region in the other said aerial image,
  determining the registration error of said feature as the distance of the position of said feature in said first aerial image from the position of said feature in said second aerial image, and
  determining the distance on the basis of the at least one difference between the positions of said at least one region in said aerial images,
  wherein said at least one designated region is masked, all image data of the aerial image outside the masked region being suppressed.

28. The method of claim 27 in which at least one of the following effects is taken into account in the simulation of said second aerial image: proximity effects, distortion due to an objective lens of the position measuring device, topography of the mask, and refractive index of the mask.

29. The method of claim 27 in which the simulation of said second aerial image is based on pattern specifications of the mask that are in the form of a continuous transmission function, said second aerial image being determined as a matrix of discrete intensity values, a discretization of the spectrum of the mask being performed without further approximation.

30. The method of claim 27 in which at least one region of said feature is defined that will be taken into account in determining the distance.

31. The method of claim 30 in which said at least one region of said feature is embodied as an edge of said feature.

32. A method for determining a registration error of a feature on a mask, the registration error indicating a deviation of a nominal position of the feature from its actual position on the mask, the method comprising:
providing a first aerial image that was captured by a position measuring device and includes at least said feature, said feature comprising a registration pattern or marker,
simulating, from pattern specifications of the mask, a second aerial image that includes at least said feature, taking into account at least one effect that causes distortion of said first aerial image, and
determining the registration error of said feature as the distance of the position of said feature in said first aerial image from the position of said feature in said second aerial image,
wherein a first position of said at least one edge is adopted as the nominal position from the pattern specifications of the mask, and a second position of said edge is determined as the actual position from the pattern specifications of the mask and from the difference between the positions of said at least one region in said aerial images.

33. The method of claim 32 in which at least one of the following effects is taken into account in the simulation of said second aerial image: proximity effects, distortion due to an objective lens of the position measuring device, topography of the mask, and refractive index of the mask.

34. The method of claim 32 in which the simulation of said second aerial image is based on pattern specifications of the mask that are in the form of a continuous transmission function, said second aerial image being determined as a matrix of discrete intensity values, a discretization of the spectrum of the mask being performed without further approximation.

35. The method of claim 32 in which at least one region of said feature is defined that will be taken into account in determining the distance.

36. The method of claim 35 in which said at least one region of said feature is embodied as an edge of said feature.

37. A position measuring device for determining a registration error of a feature on a mask, which device comprises a control unit that performs a method for determining a registration error of a feature on a mask, the registration error indicating a deviation of a nominal position of the feature from its actual position on the mask, the method comprising:
providing a first aerial image that was captured by a position measuring device and includes at least said feature, said feature comprising a registration pattern or marker,
simulating, from pattern specifications of the mask, a second aerial image that includes at least said feature, taking into account at least one effect that causes distortion of said first aerial image,
designating at least one region in the first or second aerial image, in which the at least one designated region is masked, all image data of the aerial image outside the masked region being suppressed
determining a position of the region in the other the aerial image,
determining the registration error of said feature as the distance of the position of said feature in said first aerial image from the position of said feature in said second aerial image, and
determining the distance on the basis of the at least one difference between the positions of the at least one region in the aerial images.

38. The position measuring device of claim 37 in which at least one of the following effects is taken into account in the simulation of the second aerial image: proximity effects, distortion due to an objective lens of the position measuring device, topography of the mask, and refractive index of the mask.

39. The position measuring device of claim 37 in which the simulation of the second aerial image is based on pattern specifications of the mask that are in the form of a continuous transmission function, the second aerial image being determined as a matrix of discrete intensity values, a discretization of the spectrum of the mask being performed without further approximation.

40. The position measuring device of claim 37 in which at least one region of the feature is defined that will be taken into account in determining the distance.

41. The position measuring device of claim 40 in which the at least one region of the feature is embodied as an edge of the feature.

42. A position measuring device for determining a registration error of a feature on a mask, which device comprises a control unit that performs a method for determining a registration error of a feature on a mask, the registration error indicating a deviation of a nominal position of the feature from its actual position on the mask, the method comprising:
providing a first aerial image that was captured by a position measuring device and includes at least said feature, said feature comprising a registration pattern or marker,
simulating, from pattern specifications of the mask, a second aerial image that includes at least said feature, taking into account at least one effect that causes distortion of said first aerial image,
determining the registration error of said feature as the distance of the position of said feature in said first aerial image from the position of said feature in said second aerial image,
wherein at least one region of the feature is defined that will be taken into account in determining the distance, and
wherein a first position of the at least one edge is adopted as the nominal position from the pattern specifications of the mask, and a second position of the edge is determined as the actual position from the pattern specifications of the mask and from the difference between the positions of the at least one region in the aerial images.

43. The position measuring device of claim 42 in which at least one of the following effects is taken into account in the simulation of the second aerial image: proximity effects, distortion due to an objective lens of the position measuring device, topography of the mask, and refractive index of the mask.

44. The position measuring device of claim 42 in which the simulation of the second aerial image is based on pattern specifications of the mask that are in the form of a continuous transmission function, the second aerial image being determined as a matrix of discrete intensity values, a discretization of the spectrum of the mask being performed without further approximation.

45. The position measuring device of claim 42 in which the method performed by the control unit comprises:
  designating, in the first and the second aerial image, at least one region of the feature that is to be taken into account in determining the registration error,
  determining the at least one first and second position of the at least one region, and
  determining the distance on the basis of the at least one first and second positions of the at least one region in the aerial images.

46. The position measuring device of claim 45 in which the at least one region is embodied as at least one edge of the feature, the at least one position of the edge being determined by a threshold value method.

* * * * *

UNITED STATES PATENT AND TRADEMARK OFFICE
CERTIFICATE OF CORRECTION

PATENT NO.        : 9,303,975 B2
APPLICATION NO.   : 13/229396
DATED             : April 5, 2016
INVENTOR(S)       : Michael Arnz et al.

It is certified that error appears in the above-identified patent and that said Letters Patent is hereby corrected as shown below:

IN THE SPECIFICATION

Column 14

Line 24, delete "is the" and insert -- is then --.

Line 26, delete "is the" and insert -- is then --.

Signed and Sealed this
Fourteenth Day of June, 2016

Michelle K. Lee
*Director of the United States Patent and Trademark Office*